(12) United States Patent
Chao et al.

(10) Patent No.: US 12,051,728 B2
(45) Date of Patent: Jul. 30, 2024

(54) SEMICONDUCTOR SCHOTTKY RECTIFIER DEVICE

(71) Applicant: Diodes Incorporated, Plano, TX (US)

(72) Inventors: Kolins Chao, Zhubei (TW); John Huang, New Taipei (TW)

(73) Assignee: DIODES INCORPORATED, Plano, TX (US)

( * ) Notice: Subject to any disclaimer, the term of this patent is extended or adjusted under 35 U.S.C. 154(b) by 0 days.

(21) Appl. No.: 18/334,879

(22) Filed: Jun. 14, 2023

(65) Prior Publication Data
US 2023/0343836 A1 Oct. 26, 2023

Related U.S. Application Data

(60) Division of application No. 17/985,046, filed on Nov. 10, 2022, now Pat. No. 11,916,117, which is a
(Continued)

(51) Int. Cl.
*H01L 29/417* (2006.01)
*H01L 23/00* (2006.01)
(Continued)

(52) U.S. Cl.
CPC ............ *H01L 29/417* (2013.01); *H01L 24/13* (2013.01); *H01L 29/404* (2013.01);
(Continued)

(58) Field of Classification Search
CPC ... H01L 29/417; H01L 29/404; H01L 29/407; H01L 29/8725; H01L 2224/13021;
(Continued)

(56) References Cited

U.S. PATENT DOCUMENTS

| 7,323,386 B2 * | 1/2008 | Yilmaz | ............... H01L 29/0623 257/256 |
| 2003/0040144 A1 * | 2/2003 | Blanchard | ........... H01L 29/7806 257/373 |

(Continued)

FOREIGN PATENT DOCUMENTS

CN  105762200 A  *  7/2016  ............. H01L 29/41

OTHER PUBLICATIONS

Dai et al., Trench Schottky diode structure and its preparation method, 2016, machine translation of CN 105762200A, pp. 1-4. (Year: 2016).*

(Continued)

*Primary Examiner* — Natalia A Gondarenko
(74) *Attorney, Agent, or Firm* — Kilpatrick Townsend & Stockton LLP

(57) ABSTRACT

A method for forming a semiconductor Schottky rectifier device includes providing a semiconductor substrate, forming a hard mask for trench etch including openings for guard rings, an anode region, and a cathode region, and etching semiconductor epitaxial material layer to form a plurality of trenches. The method also includes forming a first dielectric layer and depositing a polysilicon layer, performing an anisotropic etch of the polysilicon layer to form polysilicon elements on sidewalls of the trench, and depositing and etching a second dielectric layer to expose a Schottky diode region and a bottom region of the trench in the cathode region. The method further includes depositing a first metal layer and performing a thermal treatment to form metal silicide in the Schottky diode region and the cathode region and forming a second metal layer and separating the second metal layer into an anode electrode and a cathode electrode.

16 Claims, 24 Drawing Sheets

Related U.S. Application Data continuation-in-part of application No. 16/922,048, filed on Jul. 7, 2020, now Pat. No. 11,527,627.

(60) Provisional application No. 62/960,740, filed on Jan. 14, 2020.

(51) Int. Cl.
*H01L 29/40* (2006.01)
*H01L 29/872* (2006.01)

(52) U.S. Cl.
CPC ........ *H01L 29/407* (2013.01); *H01L 29/8725* (2013.01); *H01L 2224/13021* (2013.01); *H01L 2224/13144* (2013.01); *H01L 2224/13155* (2013.01)

(58) Field of Classification Search
CPC . H01L 2224/13144; H01L 2224/13155; H01L 2224/03848; H01L 2224/0401; H01L 2224/05558; H01L 24/05; H01L 24/11; H01L 24/03; H01L 24/13; H01L 24/14; H01L 29/47; H01L 29/66143; H01L 29/0615; H01L 29/0684; H01L 29/41; H01L 29/872; H01L 29/0619; H01L 2224/05624; H01L 2224/13022; H01L 2224/1403; H01L 2224/94; H01L 2224/1146; H01L 29/66712–66734; H01L 29/7802–7815; H01L 29/66666; H01L 29/7827–7828; H01L 29/78642; H01L 27/085–098; H01L 27/0922; H01L 27/105; H01L 27/11526; H01L 27/11546; H01L 21/8232; H01L 21/8239; H01L 21/823462; H01L 21/823842; H01L 21/823857; H01L 21/82348; H01L 2924/01079; H01L 2924/01014; H01L 2924/01029; H01L 2224/03; H01L 2224/11
USPC ................. 257/212, 288, 330, 334, E29.316
See application file for complete search history.

(56) References Cited

U.S. PATENT DOCUMENTS

2006/0263930 A1\* 11/2006 Ito ........................... H01L 25/16
438/149
2009/0065814 A1\* 3/2009 Bhalla ............... H01L 29/66727
257/230

OTHER PUBLICATIONS

Office Action for Korean Patent Application No. 10-2021-0004877, mailed Mar. 25, 2024, 11 pages.

\* cited by examiner

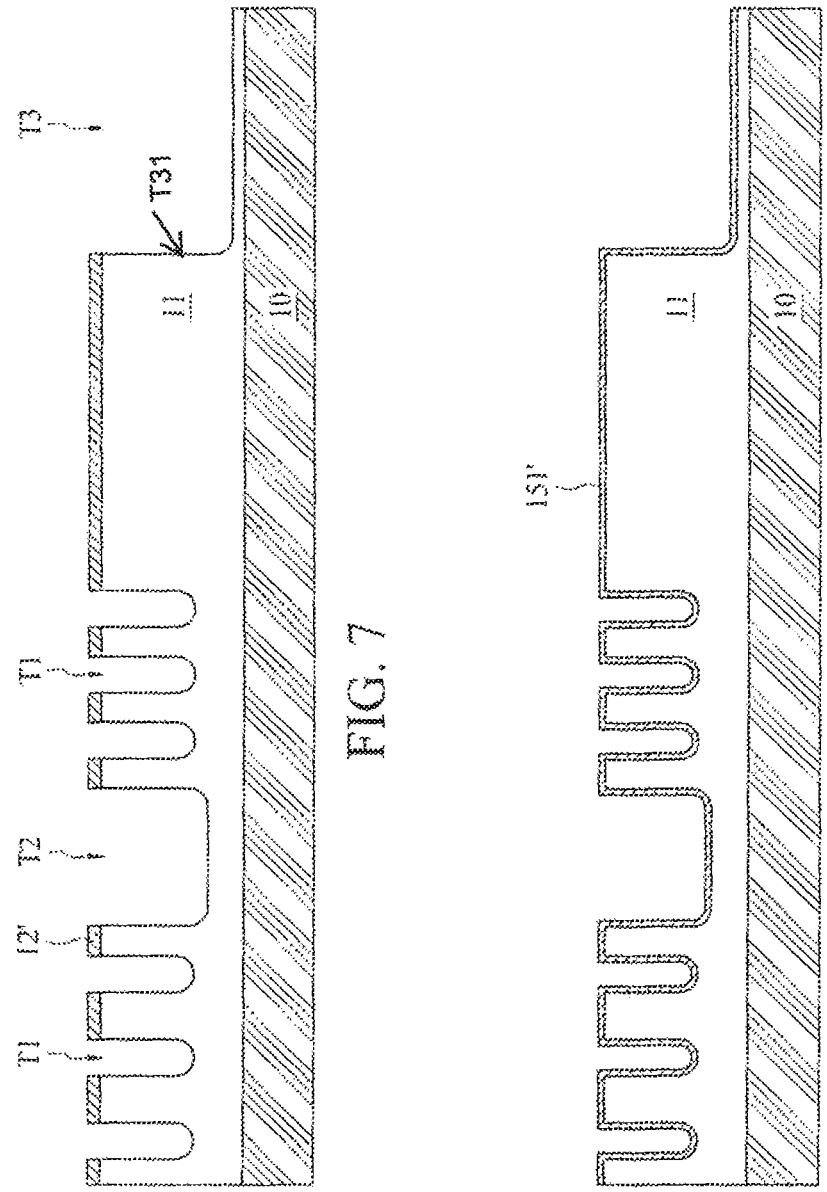

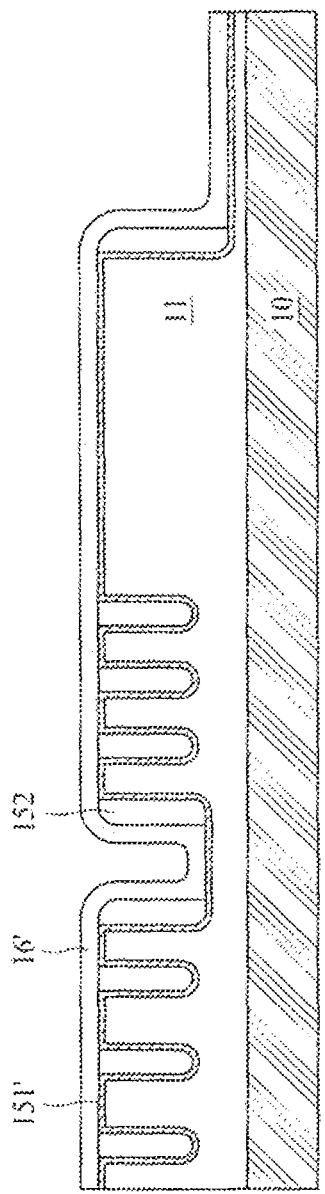
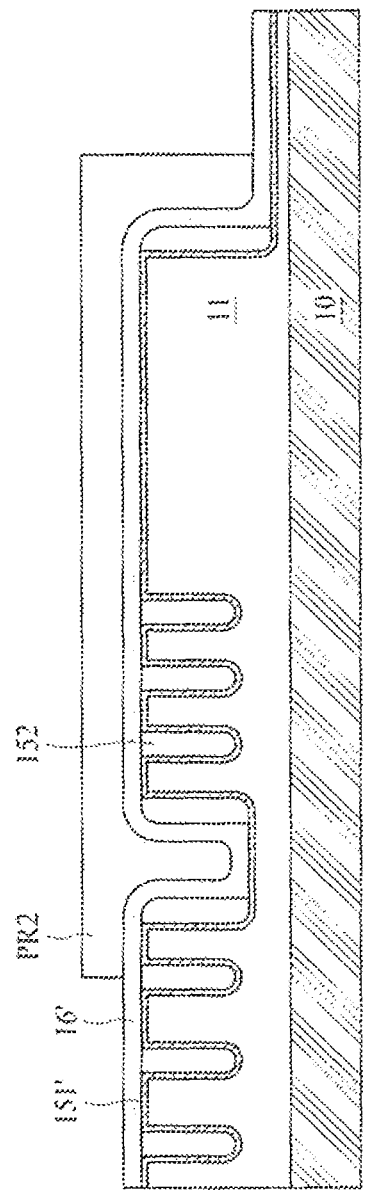

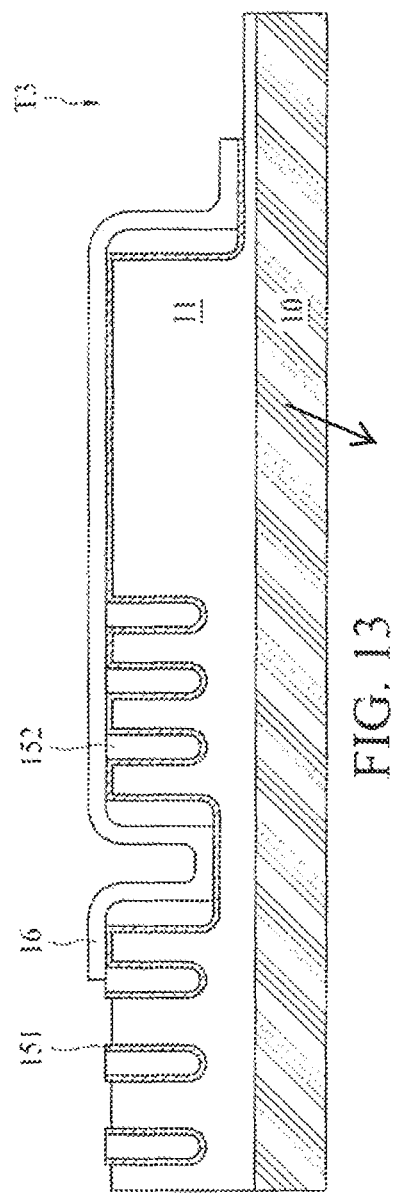
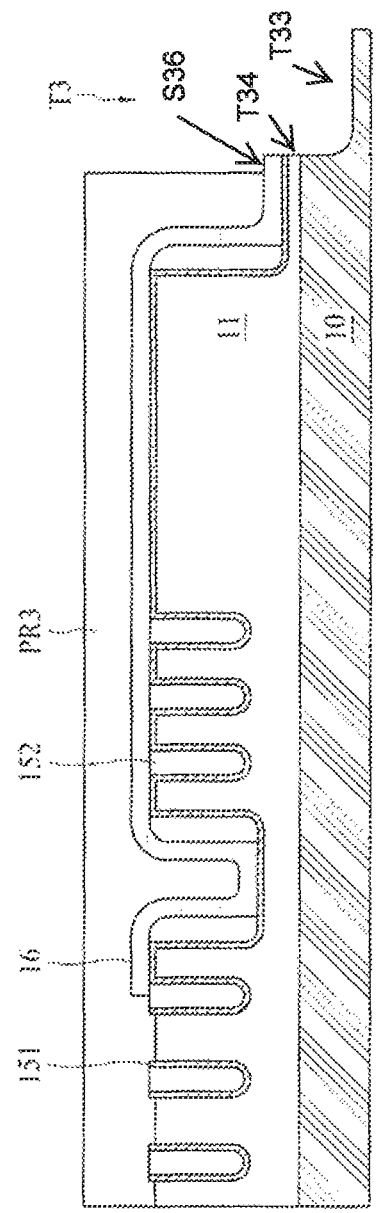

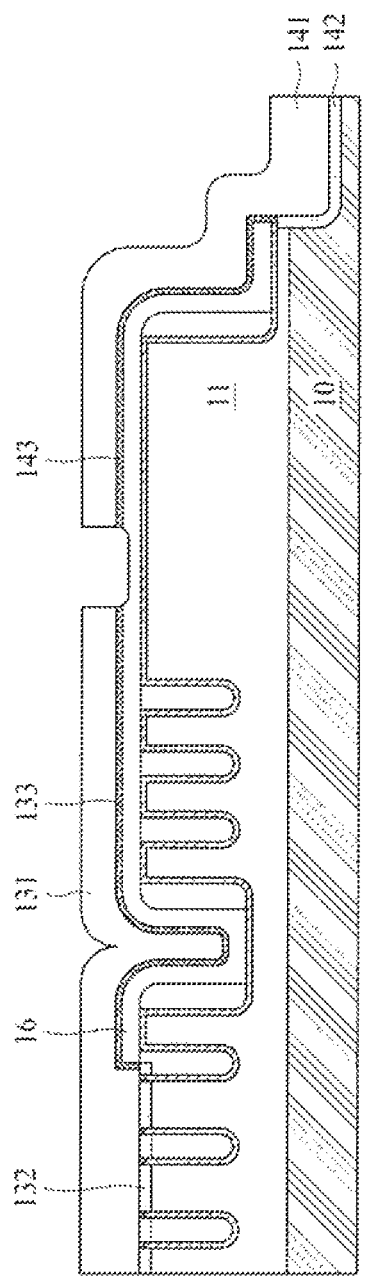
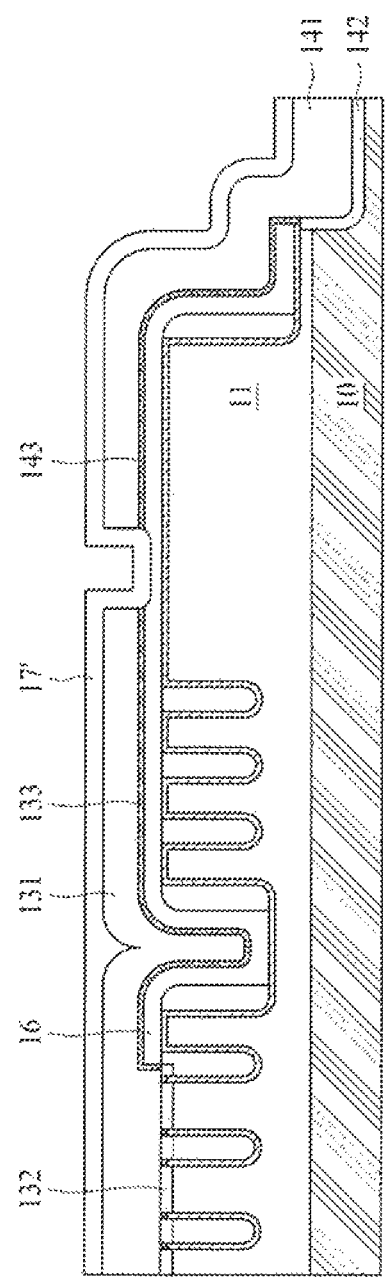

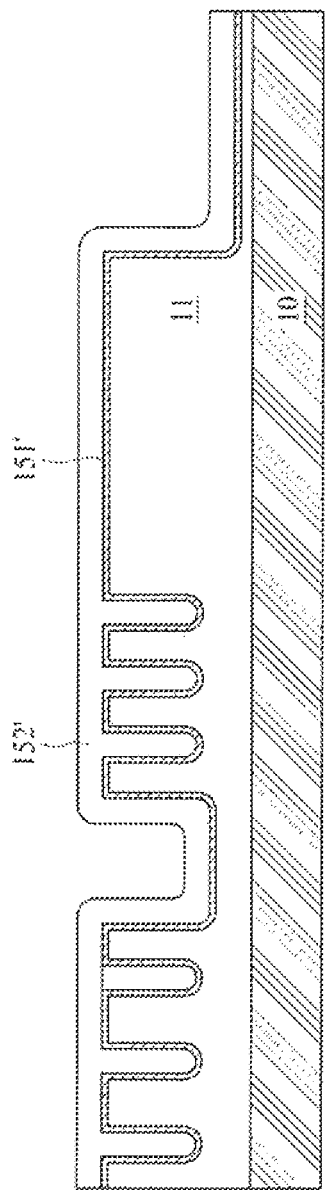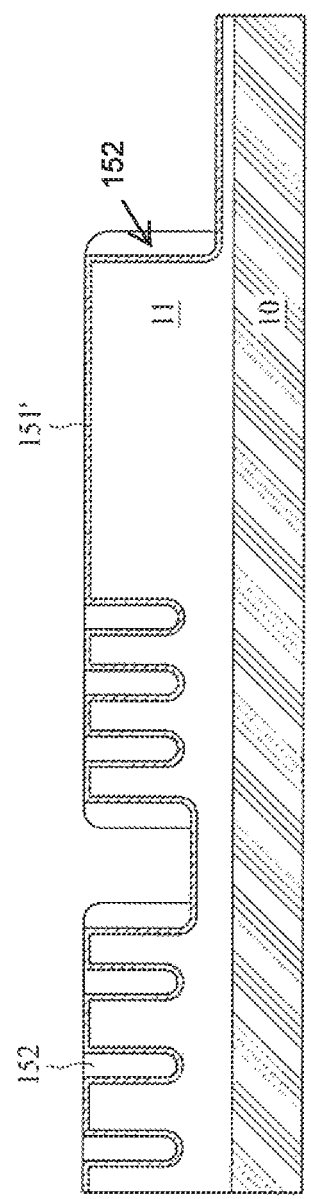
FIG. 28
FIG. 29

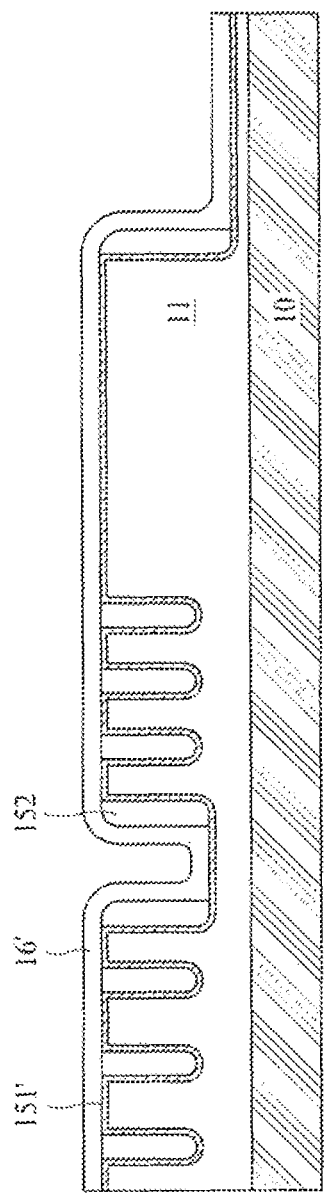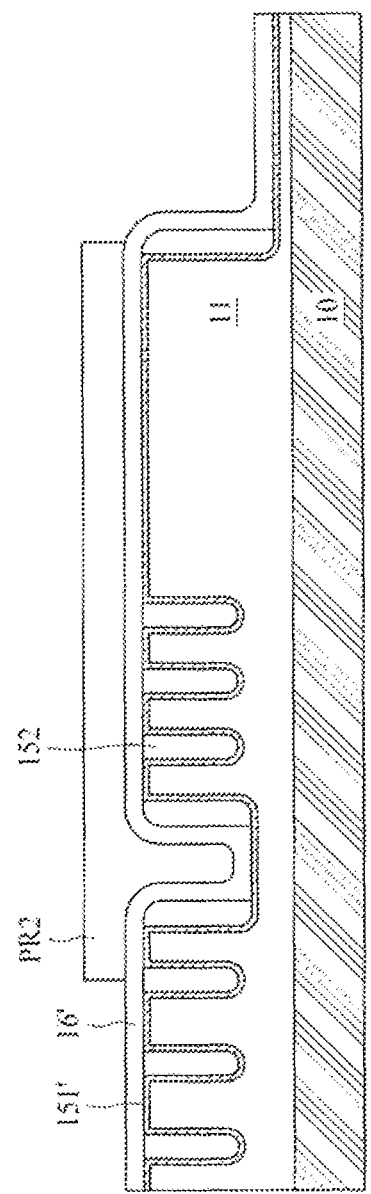

SEMICONDUCTOR SCHOTTKY RECTIFIER DEVICE

CROSS-REFERENCES TO RELATED APPLICATIONS

This application is a divisional application of U.S. patent application Ser. No. 17/985,046, filed Nov. 10, 2022, which is a continuation-in-part of U.S. patent application Ser. No. 16/922,048, filed Jul. 7, 2020, now U.S. Pat. No. 11,527,627, which claims the benefit of U.S. Provisional Patent Application No. 62/960,740, filed Jan. 14, 2020, the contents of which are hereby incorporated by reference in their entireties for all purposes.

BACKGROUND OF THE INVENTION

Features that Schottky rectifiers need in order to satisfy the requirement of Chip-Scale Package (CSP) include laterally arranged anode and cathode, no lead frame, and no wire bond. FIG. 1 is a cross-section diagram of a conventional semiconductor Schottky rectifier. The Schottky rectifier in FIG. 1 includes a substrate, a semiconductor epitaxial layer (epi-layer) over the substrate, a POCl3 doped area in the epi-layer and an anode and a cathode over the epi-layer. The cathode is formed over the POCl3 doped area. The Schottky rectifier has a forward voltage (Vf) margin issue due to high epi-resistivity and high cathode contact resistance, which causes low yield. Conventionally, the thickness of the substrate is over 650 um, and Vf can be improved by the addition of a wafer backside grinding process and backside metal deposition process. For the back grinding to 50 um thickness, the process needs a wafer to wafer bonding before grinding. This process is costly. Another problem is the process fluctuation, such as when density of dopants in a POCl3 doped area changes, or back grinding and backside metal deposition condition shift, that can cause a yield problem with respect to Vf spreading. Therefore, there is a need for a novel structure, device configuration and fabrication process to overcome the problems associated with conventional planar Schottky CSP device structure.

BRIEF SUMMARY

Various embodiments are described for semiconductor Schottky rectifiers that have a better forward voltage (Vf) and leakage current (IR) characteristics. Such Schottky rectifiers can operate with a higher current, e.g., 4 ampere (A) or higher, and can have the advantages of small dimensions and broader field of applications, and can satisfy the requirement of chip-scale package (CSP).

The semiconductor devices that embody the disclosed invention generally comprise an anode structure and a cathode structure, each of which is accessible from the top surface of an epi-layer, and each of which comprises a trench structure formed in the epi-layer.

The cathode structure, in particular, is fabricated with a multi-step etching process. As a result, near the top of the epi-layer surface, the cathode trench structure forms a vertical sidewall with a horizontal extension at the bottom. The surfaces of the sidewall and the bottom extension are covered with a gate oxide film.

The gate oxide film separates the epi-layer from a polysilicon element. In some embodiments of this invention, the side of the polysilicon element away from the epi-layer sidewall is covered by an interlayer dielectric layer such as silicon dioxide; in other embodiments, this surface is covered by a metal silicide film.

Because of this novel combination of the cathode and the anode structure and the novel process with which it is fabricated, a silicon Schottky rectifier that embodies this invention can be operated at high current and has small dimensions for a chip-scale package (CSP).

According to some embodiments, a method for forming a semiconductor Schottky rectifier device includes providing a semiconductor substrate with a semiconductor epitaxial material layer disposed over the substrate, forming a hard mask for trench etch including openings for guard rings, an anode region, and a cathode region, and etching the epitaxial layer to form a plurality of trenches, including trenches for guard rings, a trench in the anode region, and a trench in the cathode region. The method also includes forming a first dielectric layer and depositing a polysilicon layer, which fills the trenches for the guard rings, and performing an anisotropic etch of the polysilicon layer to form polysilicon elements on sidewalls of the trench in the anode region and on sidewalls of the trench in the cathode region. The method further includes depositing a second dielectric layer and etching the second dielectric layer to expose a Schottky diode region and a bottom region of the trench in the cathode region, depositing a first metal layer and performing a thermal treatment to form metal silicide in the Schottky diode region and the cathode region, and forming a second metal layer and separating the second metal layer into an anode electrode and a cathode electrode.

According to some embodiments, a method for forming a semiconductor Schottky rectifier device includes providing a semiconductor substrate with a semiconductor epitaxial material layer disposed over the substrate, and etching a first cathode trench structure extending into the epitaxial layer without penetrating through the epitaxial layer, the first cathode trench structure having vertical sidewalls of the epitaxial material. The method also includes forming polysilicon elements along the vertical sidewalls of the first cathode trench structure, and depositing a dielectric layer over the first cathode trench structure and the polysilicon element. The method further includes etching a second cathode trench structure inside the first cathode trench structure to form an intermediate device structure, the second cathode trench structure extending and penetrating through the epitaxial layer to reach the substrate. The method also includes depositing a first metal layer and performing a thermal treatment to form a first silicide layer at sidewalls of the epitaxial layer and the substrate in the second cathode trench structure to form a cathode contact, and form a second silicide layer between the first metal layer and a top surface of the epitaxial layer in an anode region to form a Schottky junction diode. The second silicide layer is separated from the first silicide layer.

According to some embodiments, a semiconductor Schottky device includes a semiconductor substrate and a semiconductor epitaxial layer (epi-layer) over the substrate. The semiconductor Schottky device also includes an anode contact structure and a cathode contact structure both extending from a top surface of the epi-layer. The cathode contact structure has a trench structure into the epi-layer with a vertical sidewall of the epitaxial layer. A polysilicon element is disposed in an upper portion of the sidewall of the trench structure. A first metal silicide film is in contact with the epitaxial layer in a lower portion of the sidewall of the trench structure and in contact with the substrate at a bottom of the trench structure. The first metal silicide film is connected to the cathode contact structure. Further, a Schottky contact is disposed between a second silicide layer and the epi-layer, and the Schottky contact connected to the anode contact structure.

BRIEF DESCRIPTION OF THE DRAWINGS

FIG. 7 depicts a cross-section view of the wafer in FIG. 6 after trenches are etched extending into the wafer.

FIG. 8 depicts a cross-section view of the wafer in FIG. 7 after a gate oxide film is disposed on the top surface of the wafer.

FIG. 11 depicts a cross-section view of the wafer in FIG. 10 after an interlayer dielectric film is disposed on the top of the wafer.

FIG. 12 depicts a cross-section view of the wafer in FIG. 11 after a photoresist pattern delineating the anode and the cathode regions is disposed on the top of the wafer.

FIG. 13 depicts a cross-section view of the wafer in FIG. 12 after the exposed interlayer dielectric and gate oxide are removed by etching.

FIG. 14 depicts a second photoresist pattern applied and the exposed silicon of the wafer removed by etching.

FIG. 17 depicts the etching of an exposed metal layer to isolate the anode from the cathode.

FIG. 18 depicts the deposition of a passivation layer over the wafer in FIG. 17.

FIG. 28 depicts a cross-section view of the wafer in FIG. 27 after a polysilicon film is disposed on the top surface of the wafer.

FIG. 29 depicts a cross-section view of the wafer in FIG. 28 after the polysilicon film is etched back.

FIG. 30 depicts a cross-section view of the wafer in FIG. 29 after an interlayer dielectric film is disposed on the top of the wafer.

FIG. 31 depicts a cross-section view of the wafer in FIG. 30 after a photoresist pattern delineating the anode and the cathode regions is disposed on the top of the wafer.

DETAILED DESCRIPTION

Figure 2:
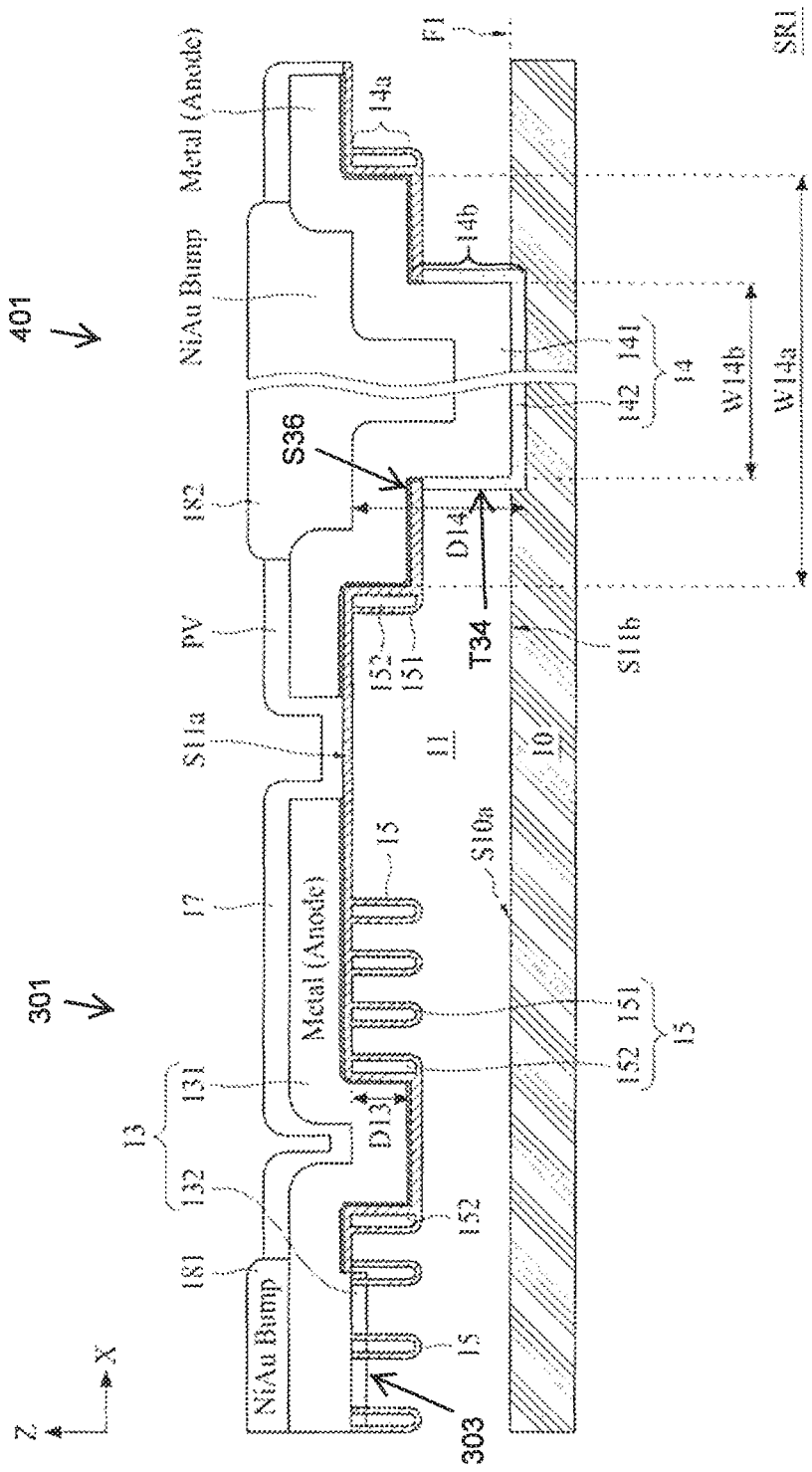
FIG. 2 depicts a cross-section view of a Schottky rectifier with a cathode formed in a trench.

FIG. 2 depicts one embodiment SR1 of this invention. The Schottky rectifier SR1 comprises a substrate 10, an epi-layer 11 disposed over the substrate 10, an anode 13 and a cathode 14. The thickness (measured along the Z direction) of the substrate 10 is about 250 micro-meters ($\mu$m). In other embodiments, the substrate may be thinned to about 5 $\mu$m. The anode 13 includes an anode metal 131 and a Schottky contact at the bottom of a silicide layer 132. The cathode 14 includes the cathode metal 141 and the silicide layer 142. The anode 13 and the cathode 14 are disposed over the epitaxial layer 11 and are laterally arranged along an extending direction (e.g., the X direction). The anode 13 and the cathode 14 are disposed in the epitaxial layer 11. The depth D13 of the anode 13 from a top surface S11a of the epitaxial layer 11 is less than a depth D14 of the cathode 14 from the same top surface. The anode 13 extends into the epitaxial layer 11 without penetrating through the epitaxial layer 11, and the cathode 14 in this embodiment extends into and penetrates through the epitaxial layer 11. In some other embodiments, the cathode 14 may stop near the interface between the epitaxial layer 11 and the substrate 10. The bottom surface S1ab of the epitaxial layer 11 and a top surface S10 a of the substrate 10 form an interface F1.

The Schottky contact 303 is disposed between the silicide layer 132 and the epitaxial layer 11. In this embodiment, the silicide is titanium silicide (TiSix).

The Schottky rectifier SR1 further includes a passivation layer 17 disposed over the anode 13, the cathode 14, and the epitaxial layer 11. The passivation layer 17 is also disposed between the anode metal 131 and the cathode metal 141 to electrically isolate them. The Schottky rectifier SR1 further includes plated NiAu bumps 181 and 182 on top of the passivation layer 17, which are electrically connect to the anode metal 131 and the cathode metal 141, respectively.

The Schottky rectifier SR1 as depicted in FIG. 2 further includes trench structures 15 in the epitaxial layer 11 surrounding the anode 13, and optionally surrounding a portion of the cathode. Each of the trench structures, including an element around the cathode, includes a dielectric layer 151 and a fill material 152. In some embodiments, the dielectric layer 151 includes oxide, and the fill material 152 includes polysilicon. A series of the trench structures 15 surrounding the anode 13 forms guard rings or a termination structure. The polysilicon layer 152 may be doped with phosphorous or other suitable dopants to lower its resistivity.

In the embodiment depicted in FIG. 2, the Schottky rectifier SR1 includes a Schottky junction 303 under the silicide layer 132, which is surrounded by trench structures 15. The anode 13 may also be surrounded by guard ring structures, and the number of guard ring structures may vary in different embodiments.

In the embodiment depicted in FIG. 2, the upper portion 14a of the cathode 14 in the epitaxial layer 11 has a width W14a along the X direction and is greater than the width of a lower portion W14b. In this embodiment, the upper portion 14a of the cathode 14 is surrounded by a polysilicon element 152.

As described above, the semiconductor Schottky device in FIG. 2 has an anode contact structure 301 and a cathode contact structure 401 both extending from a top surface of the epi-layer 11. The cathode contact structure 401 has a trench structure into the epi-layer with a vertical sidewall 403 of the epitaxial layer 11. The trench structure is shown as T3 in FIGS. 13-14 and as T3 and T33 in FIG. 33. A polysilicon element 152 is disposed in an upper portion of the sidewall of the trench structure. In the embodiment of FIG. 2, the semiconductor Schottky device also has a step feature S36 between the top surface of the epitaxial layer and the bottom of the trench structure. In some embodiments, the polysilicon element 152 is disposed in an upper part of the step feature.

A first metal silicide film 142 is in contact with the epitaxial layer 11 in a lower portion of the sidewall T34 of the trench structure and in contact with the substrate at a bottom of the trench structure. The first metal silicide film 142 is connected to the cathode contact structure 401. A Schottky contact 303 is disposed between a second silicide layer 132 and the epi-layer 11. The Schottky contact is connected to the anode contact structure 301.

In order to illustrate some of the novel properties and advantages of the Schottky rectifier SR1, an exemplary method M10 for forming such a silicon Schottky rectifier is described below.

The method M10 includes steps O101 to O130:

(O101) wafer start: providing a wafer including a silicon epitaxial layer on a heavily doped silicon substrate;
(O102) trench hard mask oxide deposition (e.g. by CVD);
(O103) trench photoresist patterning;
(O104) trench hard mask oxide dry etching (opening the cell area including the termination region, the anode, and the cathode region);
(O105) photoresist removal;
(O106) trench etching using the hard mask oxide as a mask;
(O107) sacrificial oxide growth;
(O108) sacrificial oxide removal;
(O109) gate oxide (GOX) growth;
(O110) in-situ n-type poly deposition;
(O111) poly silicon etching back;
(O112) interlayer dielectric layer (ILD) deposition;
(O113) contact photoresist patterning on anode & cathode regions;
(O114) ILD and GOX etching;
(O115) photoresist removal;
(O116) second contact photoresist patterning opening in the cathode region;
(O117) cathode region silicon recess etching to the substrate to form stepped trench in the cathode region;
(O118) photoresist removal;
(O119) Ti sputtering;
(O120) rapid thermal process (RTP) to form TiSix and Schottky junction diode;
(O121) metal layer deposition;
(O122) photoresist patterning on the metal layer;
(O123) metal etching;
(O124) photoresist removal;
(O125) passivation film deposition (e.g. by CVD);
(O126) passivation photoresist patterning;
(O127) passivation film etching;
(O128) photoresist removal;
(O129) sintering and wafer testing; and
(O130) metal plating to form contact bumps on the metal layer.

FIG. 3 to FIG. 20 are drawings of cross-sections of the Schottky rectifier SR1 at different stages of the process method M10.

Figure 3:
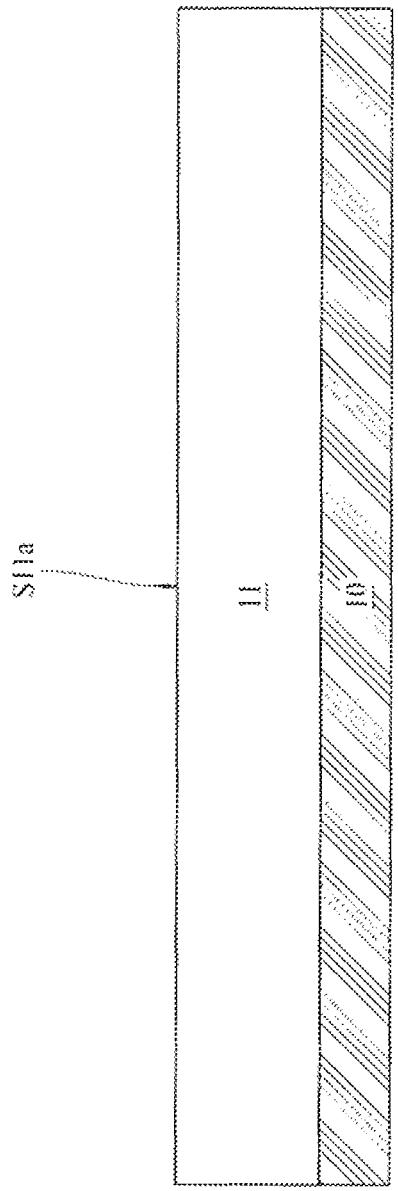
FIG. 3 depicts a cross-section view of a starting wafer.

Referring to FIG. 3, in accordance with the operation O101, a wafer including a substrate 10 and an epitaxial layer 11 over the substrate is provided. The thickness of the epitaxial layer may be from 5 μm to over 100 μm, depending on the operating voltage of the intended rectifier. The substrate 10 is heavily doped, for example, with V group elements to form an N-type substrate. The thickness of the substrate may be around 650 μm to over 900 μm depending on the diameter of the starting wafer. At the end of the manufacturing process, the substrate may be thinned down to between 20 μm to 100 μm.

Figure 4:
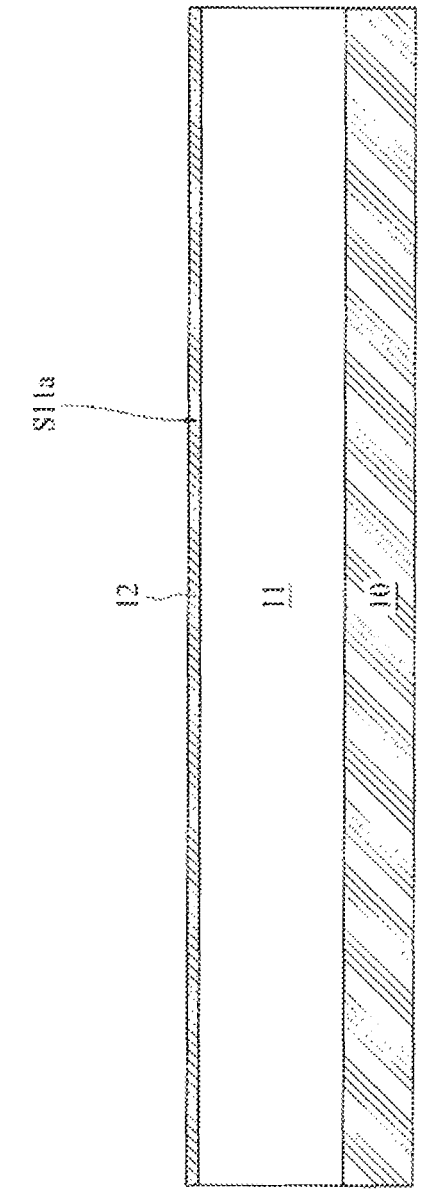
FIG. 4 depicts a cross-section view of the starting wafer in FIG. 3 after an oxide film is disposed on the top surface.

Referring to FIG. 4, in accordance with the operation O102, a hard mask layer 12 is formed over the epitaxial layer 11. The layer 12 can be formed by chemical vapor deposition (CVD) or by thermal oxidation or both.

Figure 5:
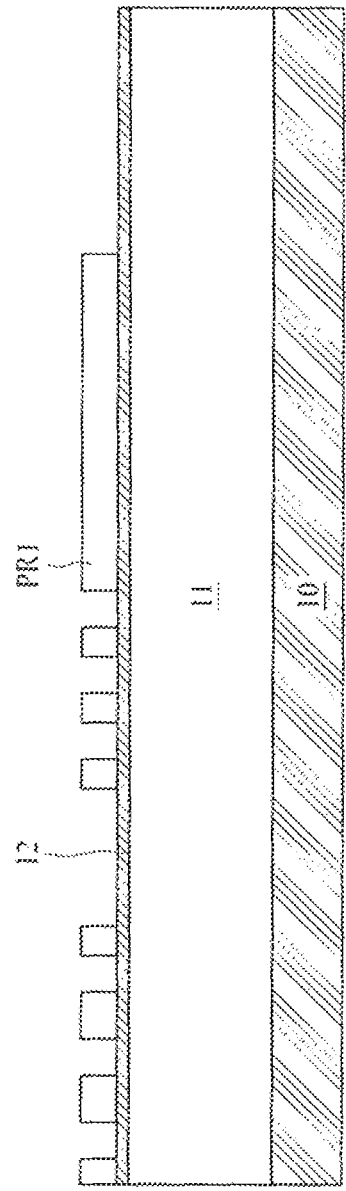
FIG. 5 depicts a cross-section view of the starting wafer in FIG. 4 with a photoresist pattern disposed over the oxide film.

Referring to FIG. 5, in accordance with the operation O103, a photoresist pattern PR1 is formed to define trenches T1, T2, and T3. As depicted in FIG. 5, the photoresist PR1 exposes portions of the oxide layer 12 in an anode region and a cathode region, and the guard rings for defining positions of the trenches T1, T2 and T3.

Figure 6:
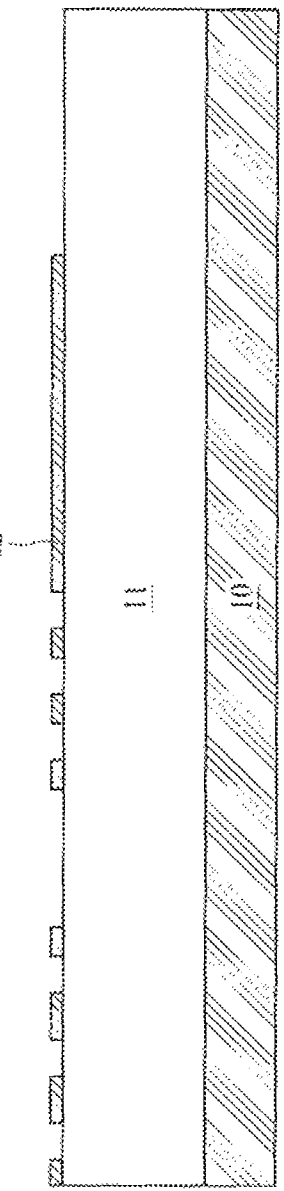
FIG. 6 depicts a cross-section view of the wafer in FIG. 5 after the oxide film is etched.

Referring to FIG. 6, in accordance with the operations O104-O105, the hard mask layer pattern is formed by etching and the photoresist PR1 is removed. The patterned hard mask layer is labeled 12'. The exposed portions of the hard mask layer 12 include the trench termination regions, the anode region, and the cathode region.

Referring to FIG. 7, in accordance with the operation O106, the exposed portions of the epitaxial layer 11 are etched to form a plurality of trenches. The plurality of trenches includes several trenches T1, a trench T2, and a trench T3 (partially depicted herein). All of the trenches T1, T2 and T3 are terminated in the epitaxial layer 11. In the embodiment, the trenches are formed by a dry etching operation, and the depth of the trench T3 is greater than the depths of the trench T2, which is deeper than the trenches T1, due to the difference in the opening size of the trenches. The relative scale of the anode 13 and cathode 14 along the X direction is for illustration only.

Referring to FIG. 8, in accordance with the operations O107-O109, a sacrificial oxide layer is formed in O107 and removed in the operation O108. The purpose of forming and removing the layer is to smooth the surfaces of the trenches. In this embodiment, the removal of the sacrificial oxide layer includes a wet etching operation. With the operation O109, a gate oxide film 151' is formed. The formed film is conformal to the surface contour of the epitaxial layer 11 including the trenches T1, T2, and T3.

Figure 9:
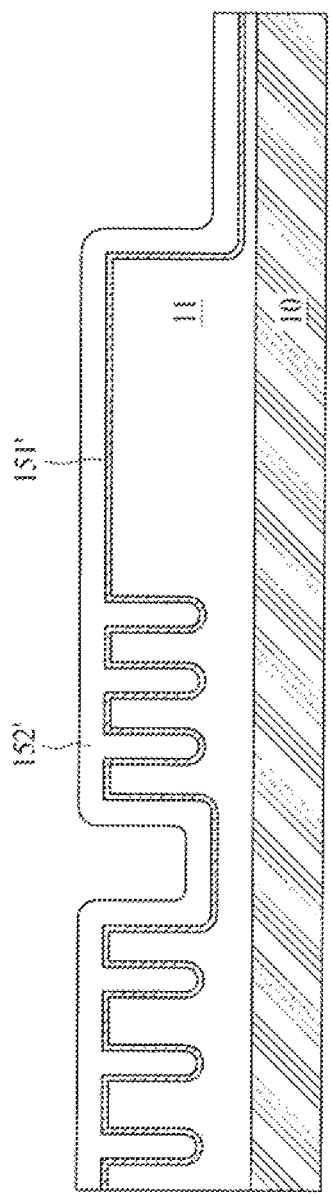
FIG. 9 depicts a cross-section view of the wafer in FIG. 8 after a polysilicon film is disposed on the top surface of the wafer.

Referring to FIG. 9, in accordance with the operation O110, a polysilicon layer 152' is deposited over the gate oxide 151'. As depicted in FIG. 9, the polysilicon layer 152' fills the trenches T1 and lines the trench surfaces of T2 and T3. The width of the trenches T1 is relatively small, so the polysilicon layer 152' fills up the trenches T1. On the other hand, because the widths of the trenches T2 and T3 are wider, the polysilicon layer 152' only covers the surface of the trenches T2 and T3 without filling up the trenches. In this embodiment, the polysilicon layer 152' is doped with a V group element to form an N-type polysilicon.

Figure 10:
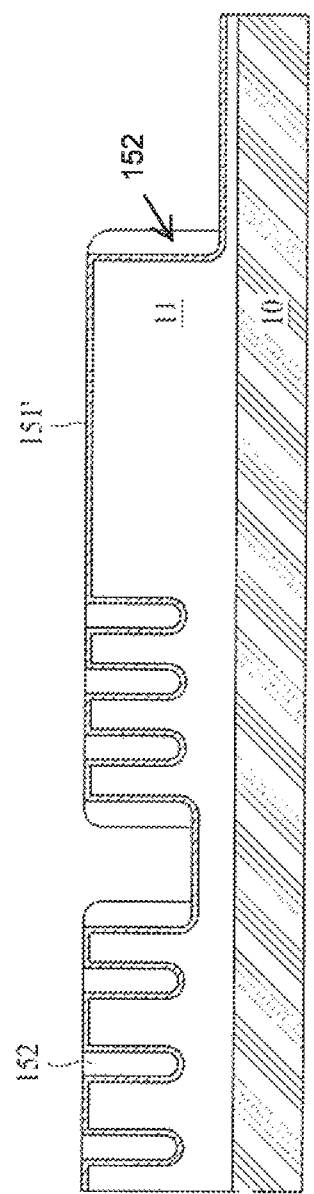
FIG. 10 depicts a cross-section view of the wafer in FIG. 9 after the polysilicon film is etched back.

Referring to FIG. 10, in accordance with the operation O111, an anisotropic etching back operation is performed to etch back the polysilicon to expose the gate oxide 151'. The etching back operation is performed to remove the surface portion of the polysilicon layer 152' to form the polysilicon filler 152 inside the trenches T1. It also leaves the sidewalls of the trenches T2 and T3 covered by polysilicon sidewall elements.

Referring to FIG. 11, in accordance with the operation O112, an interlayer dielectric layer (ILD) 16' is deposited on the wafer surface. In this embodiment, the ILD 16' is an oxide layer. The ILD 16' lines the trenches T2 and T3 and covers the polysilicon sidewall features inside the trenches T2 and T3.

Referring to FIG. 12, in accordance with the operation O113, a photoresist pattern PR2 is in place to cover the trench T2 and a portion of the trench T3, exposing the underneath oxide layer 16'. The pattern PR2 is to define the contacts in the anode region and the cathode region. In this embodiment, the photoresist PR2 covers the polysilicon sidewalls in the trench T3.

Referring to FIG. 13, in accordance with the operations O114 and O115, the exposed portions of the ILD 16' and portions of the gate oxide 151' underlying the exposed portions of the ILD are removed by one or more etching operations. The remained portions of the gate oxide 151 are depicted in FIG. 13 as in FIG. 2. The remaining portion of the ILD 16 covers trench T2, a portion of one trench T1, and a portion of the bottom of the trench T3.

Referring to FIG. 14, in accordance with the operations O116, a photoresist pattern PR3 is formed to expose a portion of the bottom of the trench T3. In operation O117, after first removing the exposed oxide, the remaining epitaxial layer 11 at the bottom of the trench T3 is removed to expose the substrate 10, thus forming a step feature S36 near the bottom of trench T3. In some embodiments, the ILD 16 over the top of the step feature is removed to expose the remaining epi-layer 11.

Figure 15:
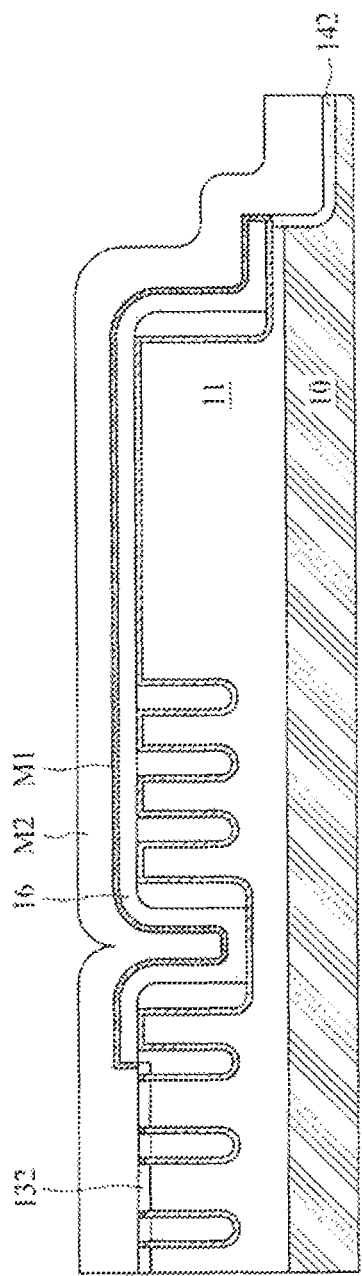
FIG. 15 depicts the wafer of FIG. 14 after the formation of a silicide layer and the subsequent deposition of a metal layer.

Referring to FIG. 15, in the operations O118, the photoresist PR3 is removed. In step O119 a metal layer M1 is placed on the wafer, in step O120 a thermal treatment is performed, and in step O121 another metal layer M2 is deposited over the wafer surface. The metal layer M1 in this embodiment includes titanium (Ti) and is deposited by sputtering. The thermal treatment includes a rapid thermal process (RTP) to form a Schottky junction diode under a titanium silicide layer 132 and a titanium silicide layer 142. As depicted in FIG. 15, the metal layer M1 in contact with silicon materials (the polysilicon layer 152, the epitaxial layer 11, and the substrate 10) form metal silicide, and a Schottky junction diode is formed at the interface of silicide 132 and the epitaxial layer 11 The portions of the metal M1 in contact with the gate oxide layer 15 and the dielectric layer 16 do not form silicide. Metal layer M2 is then formed over the metal silicide layers 132 and 142 and the remaining metal layer M1. The metal layer M2 fills up the trench T2 and conformably covers trench T3. The metal layer M2 in this embodiment is an alloy including AlSiCu.

Figure 16:
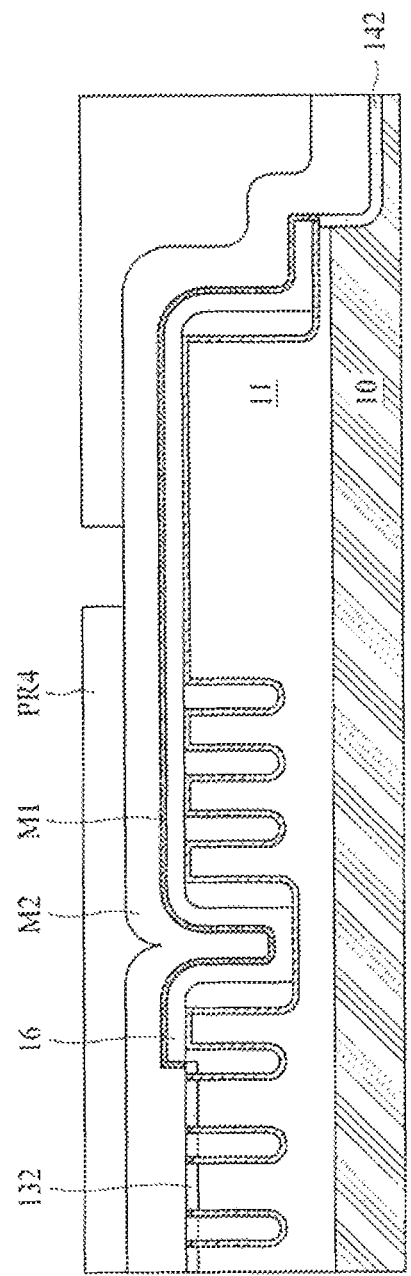
FIG. 16 depicts a photoresist pattern disposed over the metal layer.

Referring to FIG. 16, in accordance with the operation O122, a photoresist pattern PR4 is formed on the metal layer M2 to expose a gap between the anode region and the cathode region.

Referring to FIG. 17, in accordance with the operations O123, a metal etching operation is performed to remove the exposed portion of the metal layer M2 and the M1. Thus, the anode 13 and the cathode 14 are electrically separated. The portion of meal layer M1 that did not form silicide is separated into a first portion 133 in the anode region and a second portion 143 in the cathode region. The portion of the metal layer M2 in the anode region becomes the anode metal 131 and functions as a contact pad of the anode electrode 13. The portion of the metal layer M2 in the cathode region becomes the cathode metal 141 and functions as a contact pad of the cathode electrode 14. In step O124, the photoresist PR4 is removed.

Referring to FIG. 18, in accordance with the operation O125, a passivation layer 17' is deposited over the wafer. The passivation layer 17' may include oxide, nitride, oxynitride, or their combinations. The passivation layer 17' in this embodiment is formed by a CVD process.

Figure 19:
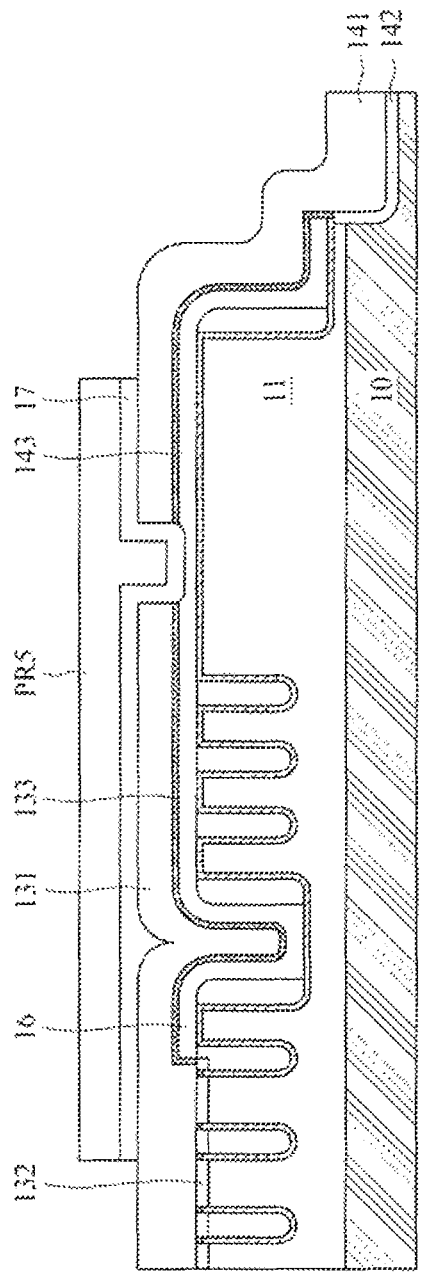
FIG. 19 depicts the structure of FIG. 18 after the passivation layer is removed from the cathode and the anode regions.

Referring to FIG. 19, in accordance with the operation O126, a photoresist pattern PR5 is formed to expose portions of the passivation layer over a portion of the anode metal 131 and a portion the cathode metal 141. The exposed portions of the passivation layer 17' are then removed by an etching process O127.

Figure 20:
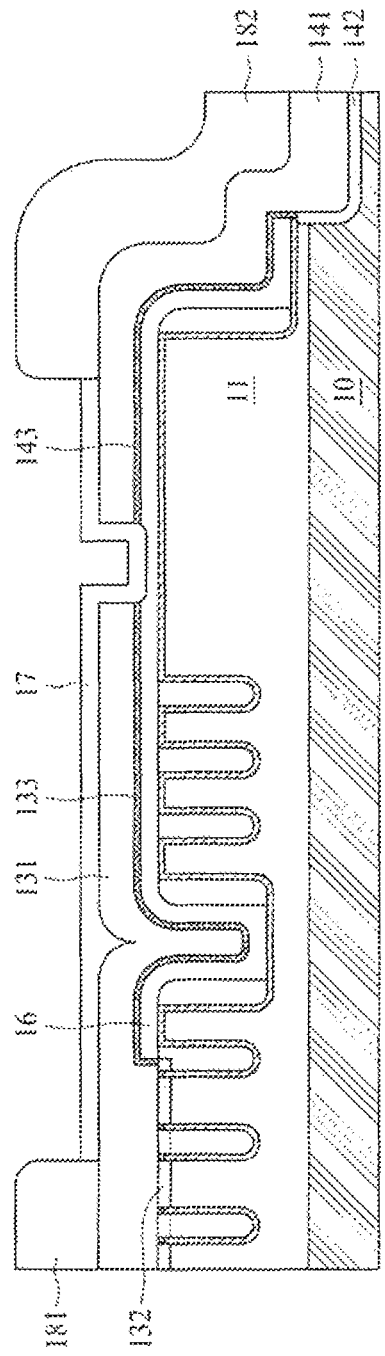
FIG. 20 depicts the structure of FIG. 19 after a layer of metal is plated at the cathode and anode regions.

Referring to FIG. 20, in accordance with the operation O128, the photoresist is removed. The wafer is then sintered in step O129 and is ready for testing for wafer level yield evaluation. In step O130, a chemical plating operation is performed to form the solder bumps 181 and 182. A die sawing process and then a final test will be performed after the operation O130.

Figure 1:
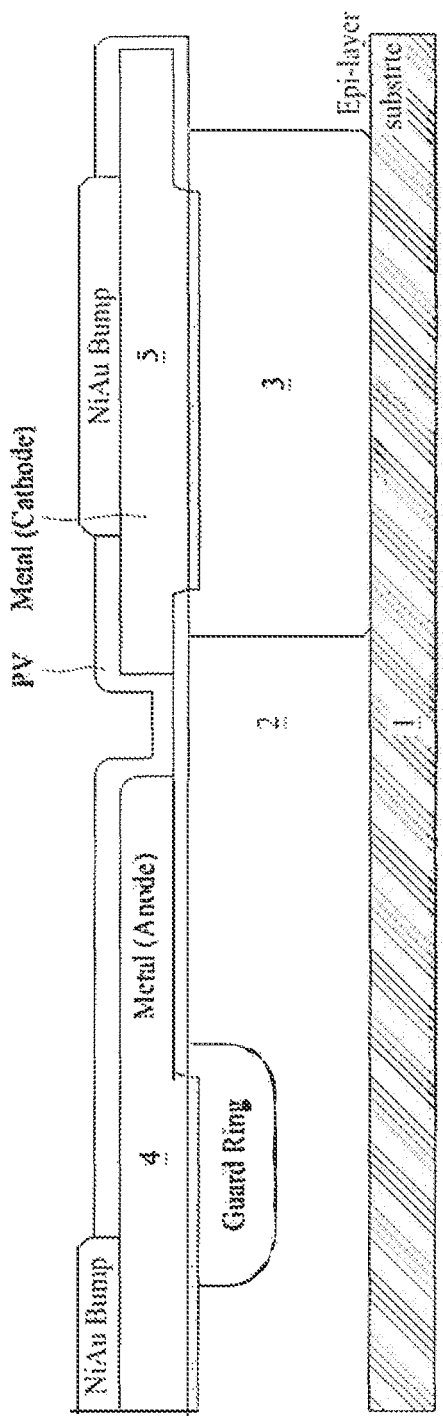
FIG. 1 depicts a cross-section view of a Schottky rectifier with a cathode formed by a POCL doped region.

The Schottky rectifier SR1 fabricated with process M10 has a cathode 14 contacting on the low resistivity substrate 10. Compared to the conventional Schottky rectifier as shown in FIG. 1, in which the cathode metal contacts a POCl3 doping region, the Schottky rectifier disclosed here has a much lower parasitic resistance at the cathode, a lower Vf, and with tighter distribution.

Additional embodiments are described below. To avoid repetition, only the differences from the first embodiment shown in FIG. 2 are described, and elements having similar functions or properties are designated with the same numerals in the drawings as in the first embodiment.

Figure 21:
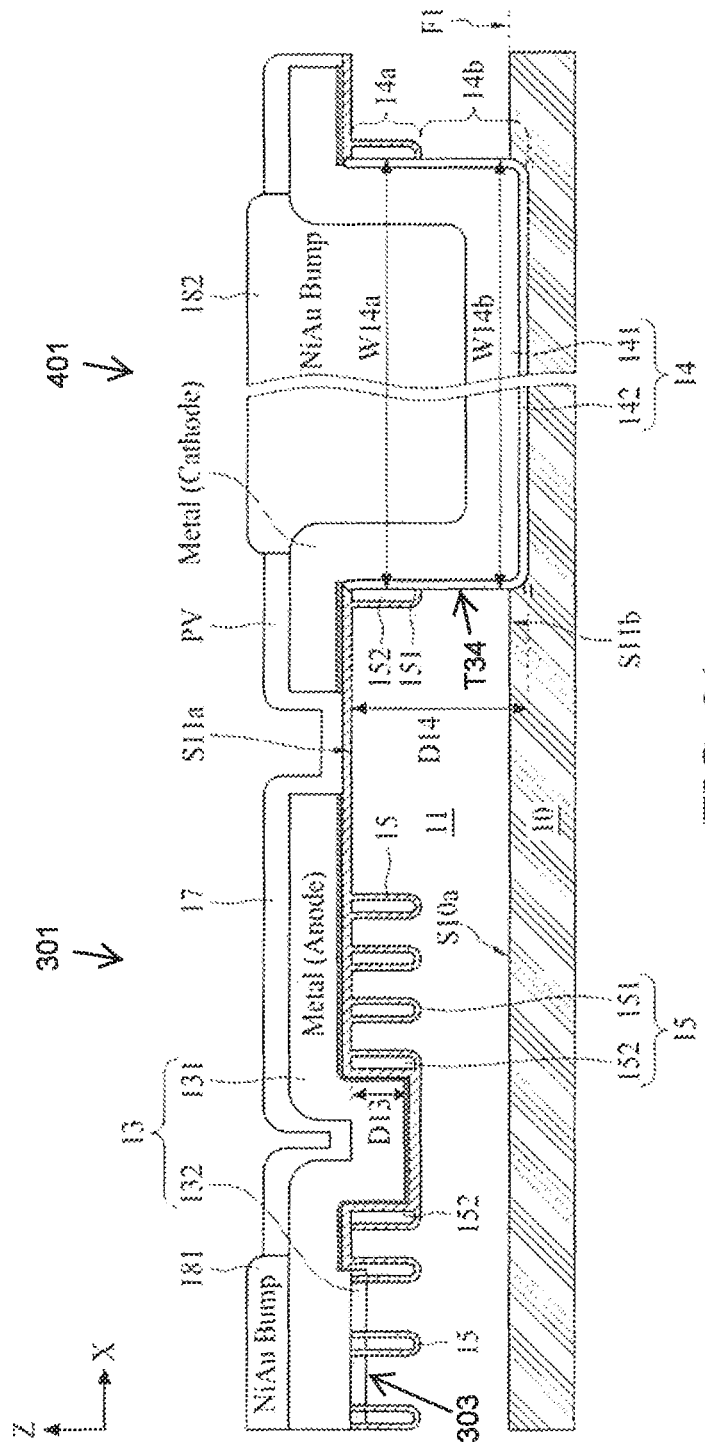
FIG. 21 depicts the cross-section view of a Schottky rectifier.
Figure 22:
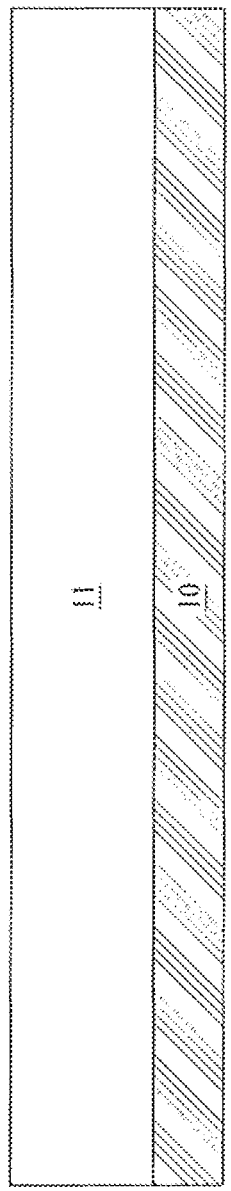
FIG. 22 depicts a cross-section view of a starting wafer.
Figure 23:
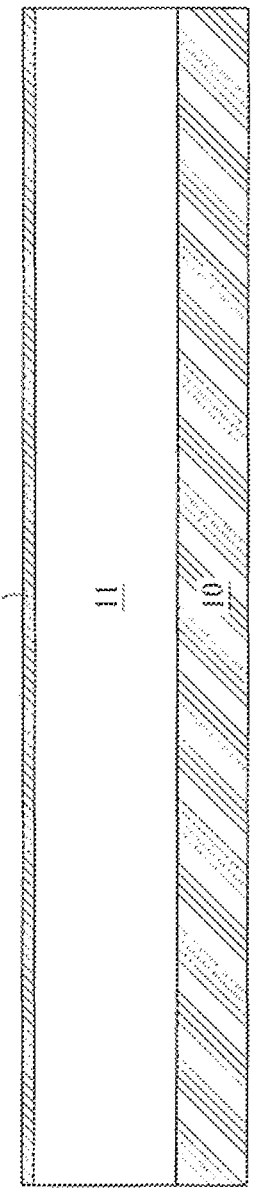
FIG. 23 depicts a cross-section view of the starting wafer in FIG. 22 after an oxide film is disposed on the top surface.
Figure 24:
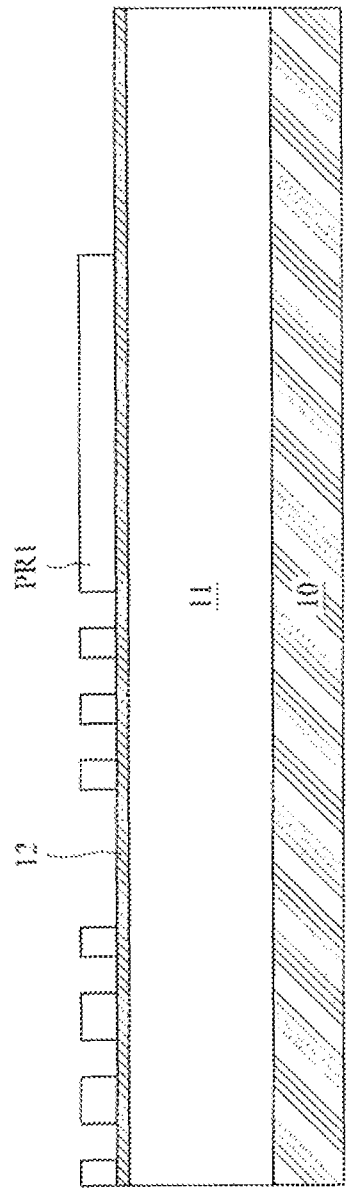
FIG. 24 depicts a cross-section view of the wafer in FIG. 23 with a photoresist pattern disposed over the oxide film.
Figure 25:
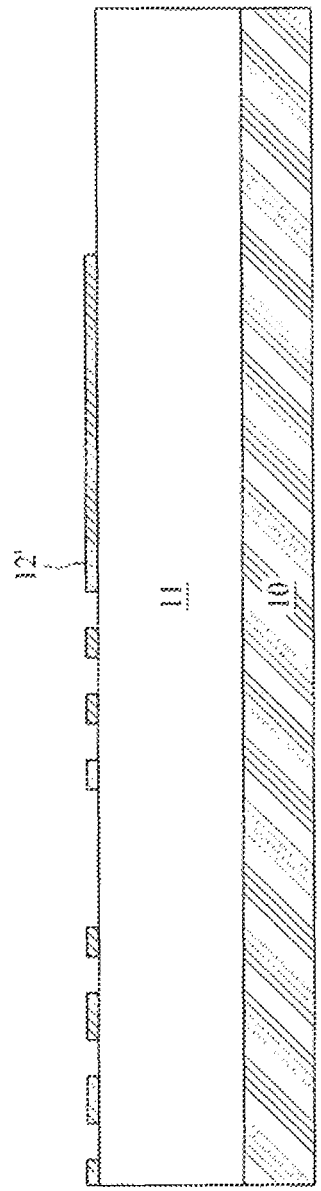
FIG. 25 depicts a cross-section view of the wafer in FIG. 24 after the oxide film is etched.

FIG. 21 is a cross-section drawing of a different Schottky rectifier SR2, which also embodies certain aspects of the present invention. The Schottky rectifier SR2 as depicted in FIG. 21 has a U-shaped cathode structure and is without a step at the bottom of the cathode trench structure. The width of the trench T3 in SR2, e. g., W14a and W14b, measured along the Z direction is substantially constant. The metal layer 141 is conformal to the trench shape, and the solder bump 182 goes deep into the trench. In addition, a metal silicide layer 142 forms on the sidewall of the cathode trench and on one side of the polysilicon feature in the cathode trench.

As shown in FIG. 21, the semiconductor Schottky device has an anode contact structure 301 and a cathode contact structure 401 both extending from a top surface of the epi-layer 11. The cathode contact structure 401 has a trench structure into the epi-layer with a vertical sidewall 403 of the epitaxial layer 11. The trench structure is shown as T3 in FIGS. 13-14 and as T3 and T33 in FIG. 33. A polysilicon element 152 is disposed in an upper portion of the sidewall of the trench structure. A first metal silicide film 142 is in contact with the epitaxial layer 11 in a lower portion of the sidewall T34 of the trench structure and in contact with the substrate at a bottom of the trench structure. The first metal silicide film 142 is connected to the cathode contact structure 401. A Schottky contact 303 is disposed between a second silicide layer 132 and the epi-layer 11. The Schottky contact is connected to the anode contact structure 301.

Method M20 below further details the fabrication process of the Schottky rectifier SR2.

The method M20 includes process steps O201 to O230:
(O201) wafer start: providing a wafer with an epitaxial layer on a doped silicon;
(O202) trench hard mask oxide deposition (e.g., by CVD oxide);
(O203) trench photoresist patterning;
(O204) trench hard mask etching;
(O205) photoresist removal;
(O206) trench etching using the patented hard mask;
(O207) sacrificial oxide growth;
(O208) sacrificial oxide removal;
(O209) gate oxide (GOX) growth;
(O210) in-situ n-type polysilicon deposition;
(O211) poly etching back;
(O212) interlayer dielectric layer (ILD) deposition;
(O213) contact photoresist pattern formation;
(O214) ILD and GOX etching;
(O215) photoresist removal;
(O216) second contact photoresist pattern deposition;
(O217) cathode region silicon etching;
(O218) photoresist removal;
(O219) titanium sputtering;
(O220) rapid thermal process (RTP) to form TiSix;
(O221) metal layer deposition;
(O222) metal photoresist pattern formation;
(O223) metal etching;
(O224) photoresist removal;
(O225) passivation film deposition;
(O226) passivation photoresist pattern formation;
(O227) passivation film etching;
(O228) photoresist removal;
(O229) sintering and wafer testing; and
(O230) metal plating to form contact bumps on the metal layer.

FIG. 22 to FIG. 39 are cross-section drawings of the Schottky rectifier SR2 at different stages of the process method M20.

As depicted in FIG. 31, the photoresist pattern formed in the operation O213 is different from the photoresist pattern formed in the operation O113 as shown in FIG. 12. The photoresist pattern PR2 in FIG. 12 covers the side of the polysilicon layer 152 in the trench T3, but the photoresist pattern PR2 in FIG. 31 exposes one side of the polysilicon layer.

Figure 32:
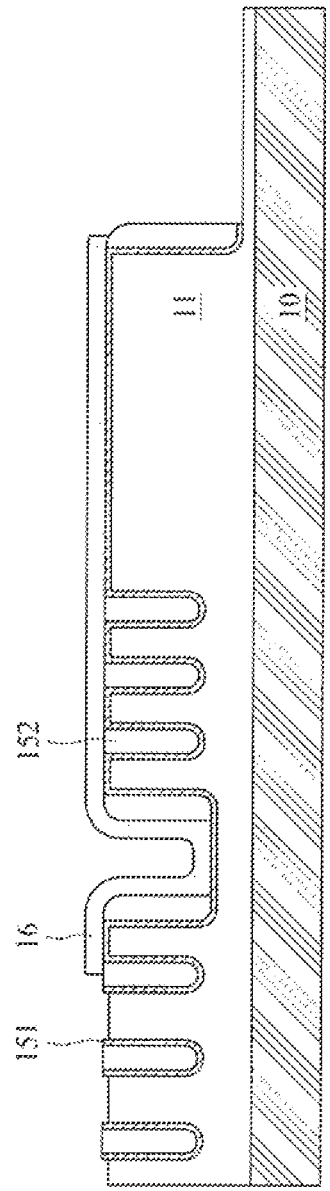
FIG. 32 depicts a cross-section view of the wafer in FIG. 31 after the exposed interlayer dielectric and gate oxide are etched.

The process steps O214 to O215 as depicted in FIG. 32 are similar to the process steps O114 to O115.

Figure 33:
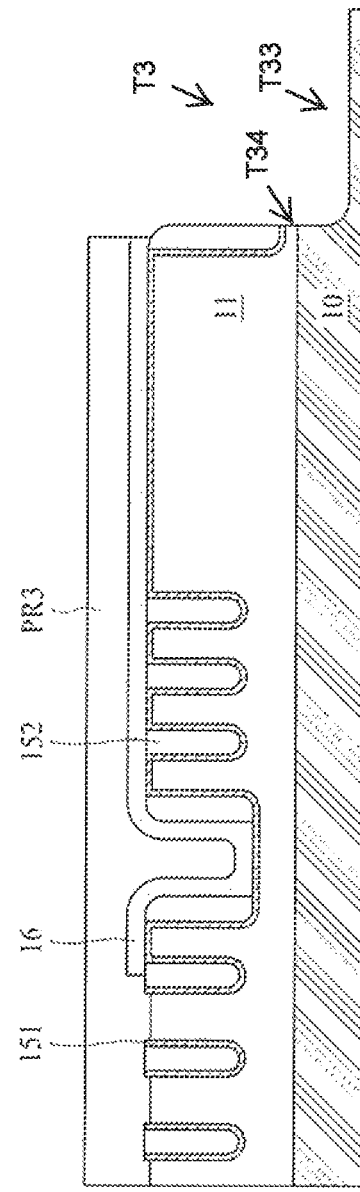
FIG. 33 depicts a second photoresist pattern applied and the exposed silicon and polysilicon sidewall.

The photoresist pattern formed in the step O216 as shown in FIG. 33 is different from the photoresist pattern formed in the step O116 as shown in FIG. 14. The photoresist pattern in FIG. 33 is substantially aligned with an edge of the oxide layer 16 over the polysilicon at the sidewalls in the trench T3. Following the etch, the trench T3 has a substantially straight sidewall as depicted in FIG. 33. The metal silicide layer 142 extends from a bottom of the trench T3 and up along the sidewall and on the side of the polysilicon element on the trench T3 sidewalls.

Figure 40:
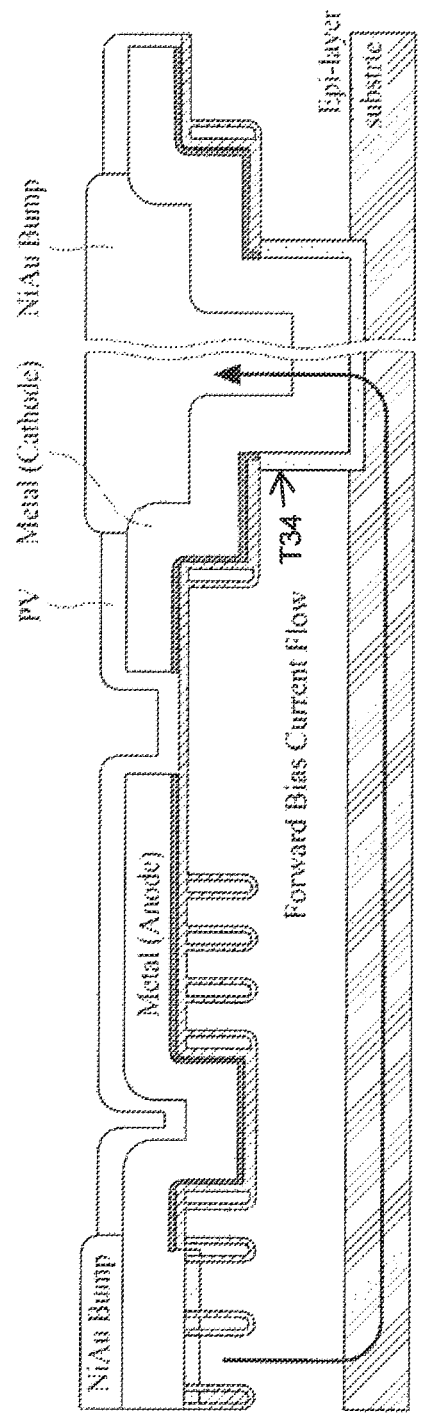
FIG. 40 depicts the cross-section view of a Schottky rectifier. The arrow depicts the direction of current flow in the Schottky rectifier.

FIG. 40 depicts the Schottky rectifier, similar to the device shown in FIG. 2, under forward bias applied across the anode and the cathode. The arrow depicts the direction of the electric current flowing from the Schottky diode through the substrate to the cathode. The current path at the cathode contact avoids the high resistive epitaxial region and improves the device performance. T first metal silicide film 142 is in contact with the epitaxial layer 11 in a lower portion of the sidewall T34 of the trench structure and improves the contact of the epitaxial layer 11 to the cathode contact.

Figure 41:
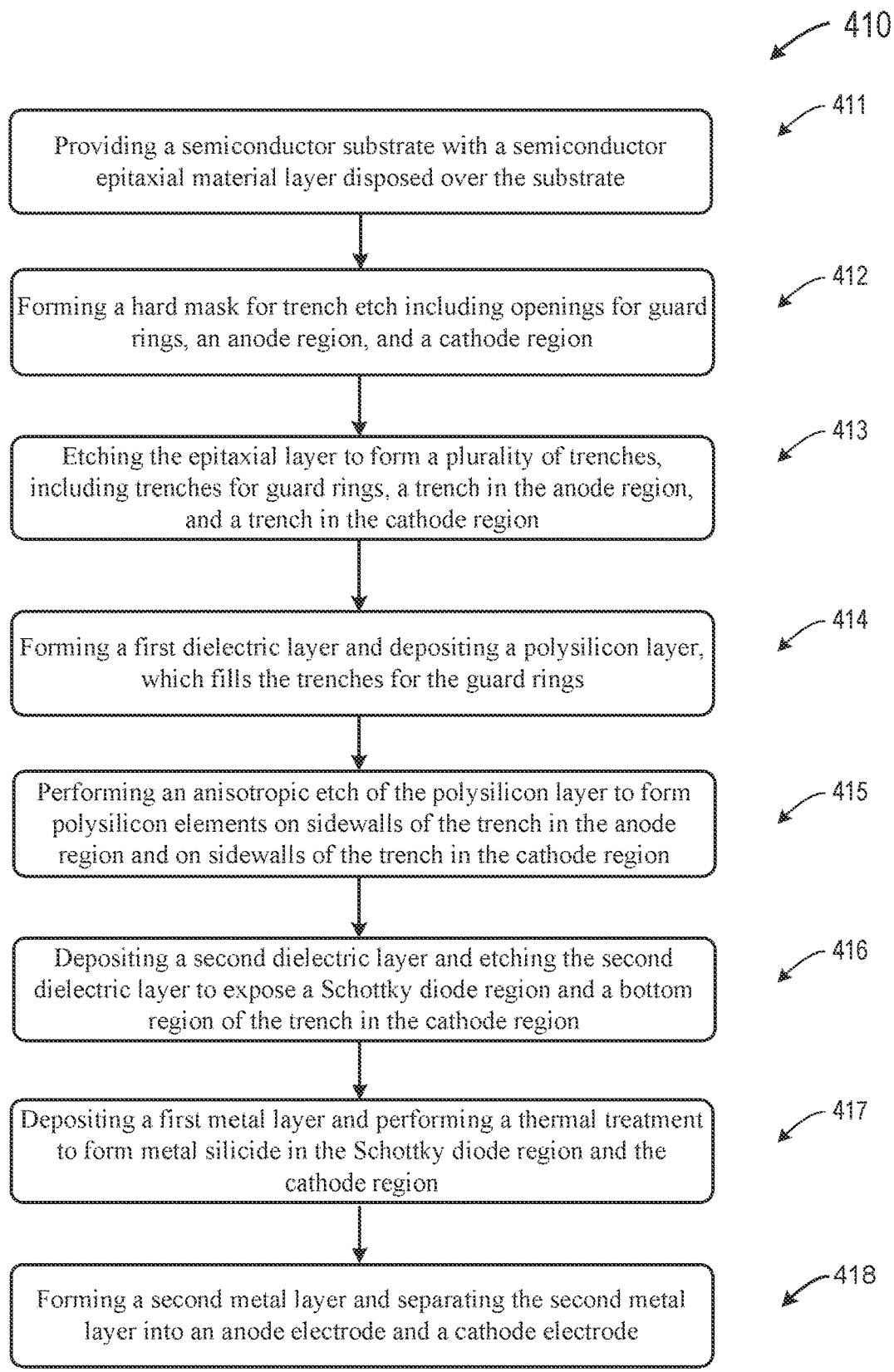
FIG. 41 is a flowchart illustrating a method for forming a semiconductor Schottky rectifier device according to some embodiments.

FIG. 41 is a flowchart illustrating a method for forming a semiconductor Schottky rectifier device according to some embodiments. As shown in FIG. 41, a method 410 can be summarized as follows and described further below.

411—providing a semiconductor substrate with a semiconductor epitaxial material layer disposed over the substrate;
412—forming a hard mask for trench etch including openings for guard rings, an anode region, and a cathode region;
413—etching the epitaxial layer to form a plurality of trenches, including trenches for guard rings, a trench in the anode region, and a trench in the cathode region;
414—forming a first dielectric layer and depositing a polysilicon layer, which fills the trenches for the guard rings;
415—performing an anisotropic etch of the polysilicon layer to form polysilicon elements on sidewalls of the trench in the anode region and on sidewalls of the trench in the cathode region;
416—depositing a second dielectric layer and etching the second dielectric layer to expose a Schottky diode region and a bottom region of the trench in the cathode region;
417—depositing a first metal layer and performing a thermal treatment to form metal silicide in the Schottky diode region and the cathode region; and
418—forming a second metal layer and separating the second metal layer into an anode electrode and a cathode electrode.

Method 410 is now described with reference to operations in methods M10 and M20 described above and FIGS. 2-40 and the accompanying text.

At 411, with reference to FIGS. 3, 4, 22, and 23, a wafer including a substrate 10 and an epitaxial layer 11 over the substrate is provided.

At 412, with reference to FIGS. 5, 6, 24, and 25, a hard mask 12 for trench is formed etch including openings T1, T2, and T3 for guard rings, an anode region, and a cathode region.

Figure 26:
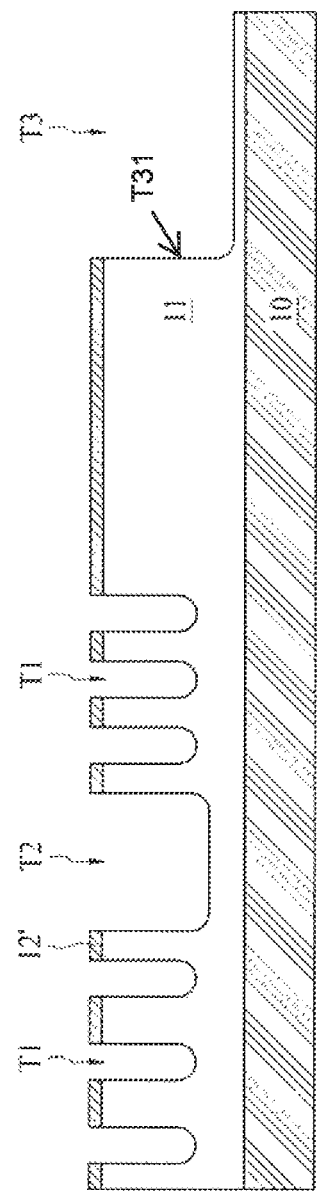
FIG. 26 depicts a cross-section view of the wafer in FIG. 25 after trenches are etched extending into the wafer.

At 413, as shown in FIGS. 7 and 26, the epitaxial layer 11 is etched to form a plurality of trenches, including trenches T1, T2, and T3 for guard rings, a trench in the anode region, and a trench in the cathode region, respectively.

Figure 27:
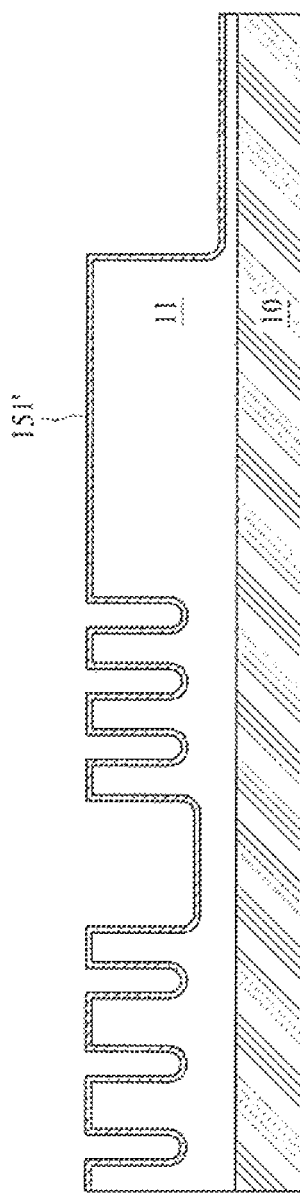
FIG. 27 depicts a cross-section view of the wafer in FIG. 26 after a gate oxide film is disposed on the top surface of the wafer.

At 414, as shown in FIGS. 8 and 27, a first dielectric layer 151' is formed and, as shown in FIGS. 9 and 28, a polysilicon layer 152' is deposited, which fills the trenches T1 for the guard rings.

At 415, as shown in FIGS. 10 and 29, an anisotropic etch of the polysilicon layer is performed to form polysilicon elements 152 on sidewalls of the trench in the anode region and on sidewalls of the trench in the cathode region.

At 416, as shown in FIGS. 11-13 and 30-31, a second dielectric layer 16' is deposited and etched to expose a Schottky diode region and a bottom region of the trench in the cathode region. The remained portion of the second dielectric layer 16 covers trench T2, portion of one trench T1, and a portion of the bottom of the trench T3.

Figure 34:
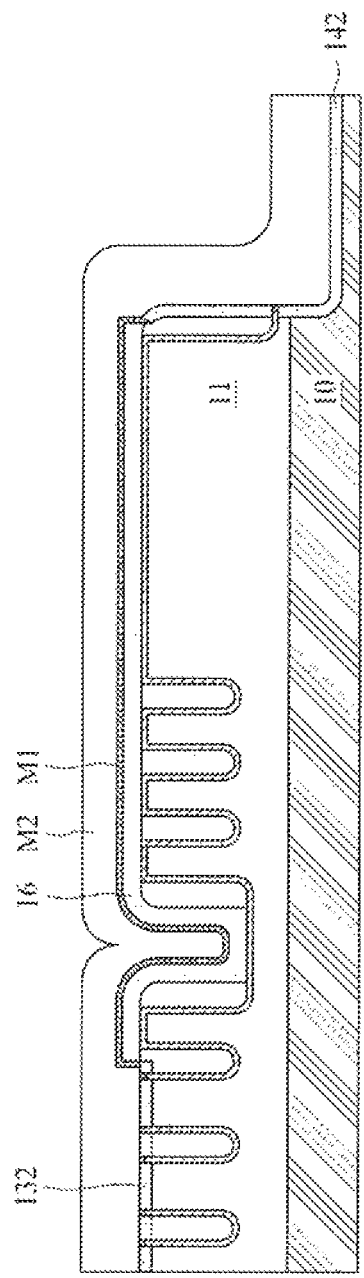
FIG. 34 depicts the wafer of FIG. 33 after the formation of a silicide layer on silicon and on the sidewall polysilicon and the subsequent deposition of a metal layer.

At 417, as shown in FIGS. 15 and 34, a first metal layer M1 is deposited, and a thermal treatment is performed to form metal silicide 132 in the Schottky diode region and metal silicide 142 in the cathode region.

At 418, as shown in FIGS. 16-17 and 35-36, a second metal layer M2 is formed, and the second metal layer is separated into an anode electrode 131 and a cathode electrode 141.

In some embodiments, the above method 410 also includes etching a second trench inside the trench in the cathode region, as shown in FIGS. 13-14 and 32-33.

In some embodiments of the above method 410, the second trench forms a step inside the trench in the cathode region as shown in FIGS. 13-14.

In some embodiments of the above method 410, the trench in the cathode region has a substantially straight sidewall, as shown in FIG. 33.

Figure 39:
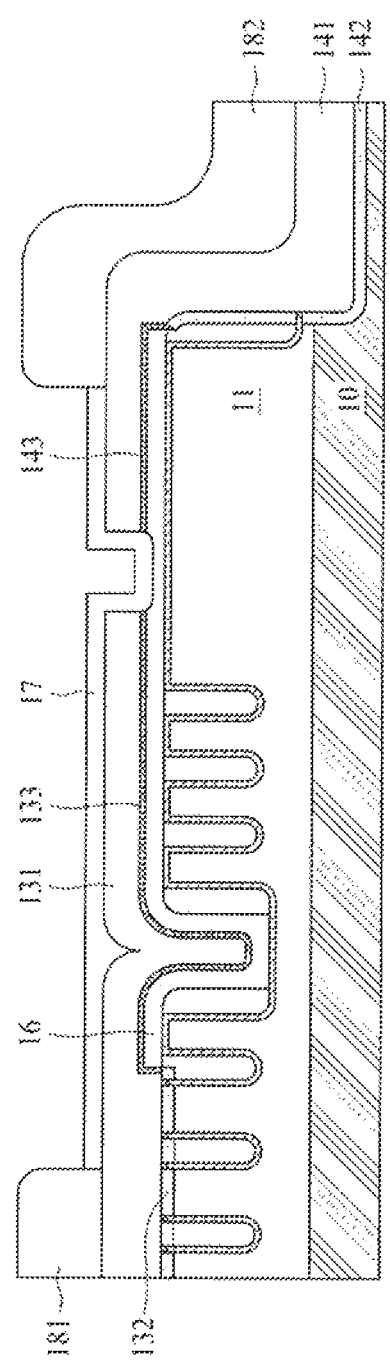
FIG. 39 depicts the structure of FIG. 38 after a layer of metal is plated at the cathode and anode regions.

In some embodiments, the above method 410 also includes forming plated NiAu bumps 181 and 182 for the anode electrode and the cathode electrode, respectively, as shown in FIGS. 20 and 39.

Figure 42:
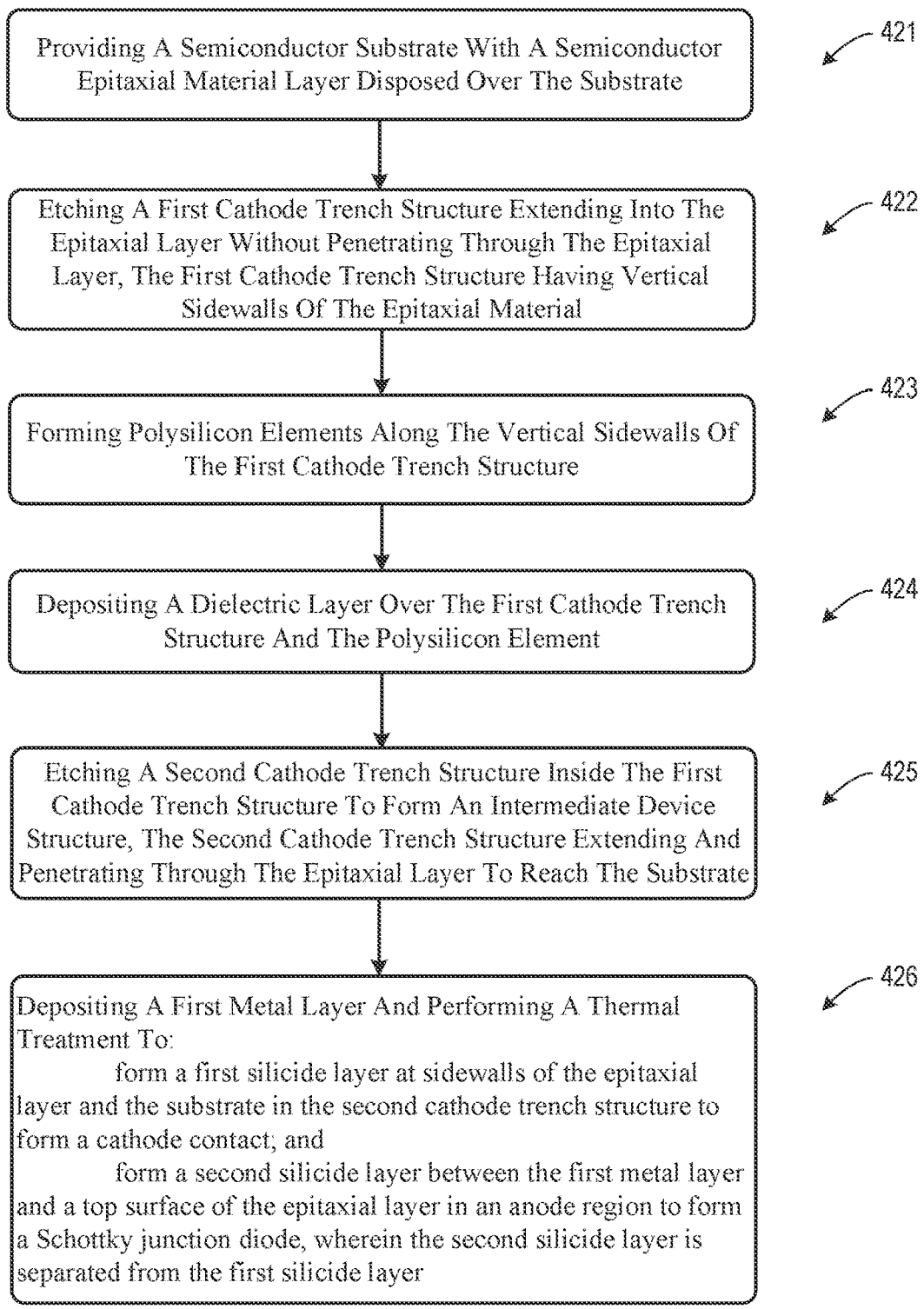
FIG. 42 is a flowchart illustrating another method for forming a semiconductor Schottky rectifier device according to some embodiments.

FIG. 42 is a flowchart illustrating another method for forming a semiconductor Schottky rectifier device according to some embodiments. As shown in FIG. 42, a method 420 can be summarized as follows and described further below.

421—providing a semiconductor substrate with a semiconductor epitaxial material layer disposed over the substrate;

422—etching a first cathode trench structure extending into the epitaxial layer without penetrating through the epitaxial layer, the first cathode trench structure having vertical sidewalls of the epitaxial material;

423—forming polysilicon elements along the vertical sidewalls of the first cathode trench structure;

424—depositing a first dielectric layer over the first cathode trench structure and the polysilicon element;

425—etching a second cathode trench structure inside the first cathode trench structure to form an intermediate device structure, the second cathode trench structure extending and penetrating through the epitaxial layer to reach the substrate;

426—depositing a first metal layer and performing a thermal treatment to:
form a first silicide layer at sidewalls of the epitaxial layer and the substrate in the second cathode trench structure to form a cathode contact; and
form a second silicide layer between the first metal layer and a top surface of the epitaxial layer in an anode region to form a Schottky junction diode, wherein the second silicide layer is separated from the first silicide layer.

Method 420 is now described with reference to operations in methods M10 and M20 described above and FIGS. 2-40 and the accompanying text.

At 421, with reference to FIGS. 3, 4, 22, and 23, a wafer including a substrate 10 and an epitaxial layer 11 over the substrate is provided.

At 422, as shown in FIGS. 7 and 26, a first cathode trench structure T3 is etched extending into the epitaxial layer 11 without penetrating through the epitaxial layer, the first cathode trench structure having vertical sidewalls T31 of the epitaxial material 11.

At 423, as shown in FIGS. 10 and 29, polysilicon elements 152 are formed along the vertical sidewalls of the first cathode trench structure;

At 424, as shown in FIGS. 11-13 and 30-31, a dielectric layer 16' is deposited over the first cathode trench structure T3 and the polysilicon element 152.

At 425, as shown in FIGS. 14 and 33, a second cathode trench structure T33 is etched inside the first cathode trench structure T3 to form an intermediate device structure, the second cathode trench structure extending and penetrating through the epitaxial layer 11 to reach the substrate 10. The second cathode trench structure T33 has vertical sidewalls T34 of the epitaxial material 11.

At 426, as shown in FIGS. 15 and 34, a first metal layer M1 is deposited, and a thermal treatment is performed to:
form a first silicide layer 142 at sidewalls of the epitaxial layer and the substrate in the second cathode trench structure to form a cathode contact; and
form a second silicide layer 132 between the first metal layer and a top surface of the epitaxial layer in an anode region to form a Schottky junction diode, wherein the second silicide layer 132 is separated from the first silicide layer 142.

In some embodiments of the above method 410, etching the second cathode trench structure forms a step feature between the top surface of the epitaxial layer and a bottom of the second cathode trench structure, as shown in FIGS. 13-14.

In some embodiments, the dielectric layer 16' is disposed on a top surface of the step feature, as shown in FIG. 14.

In some embodiments, the first metal layer M1 is disposed on the dielectric layer 16 on the polysilicon element 152, as shown in FIGS. 15 and 16.

In some embodiments, as shown in FIG. 33, etching the second cathode trench structure removes the dielectric layer on the polysilicon element such that a sidewall of the second cathode trench structure is aligned with the polysilicon element on the sidewall of the first cathode trench structure, resulting in no step feature between the top surface of the epitaxial layer and a bottom of the second cathode trench structure.

Figure 35:
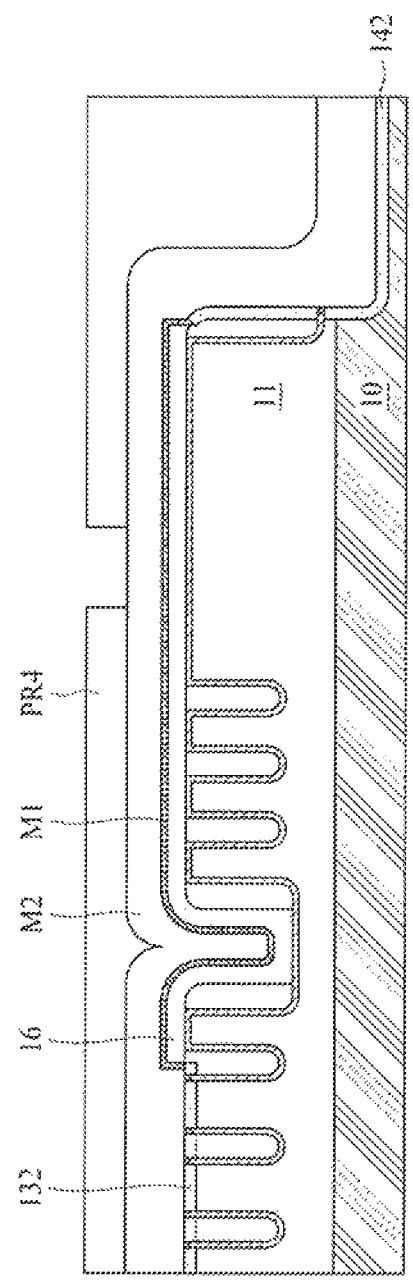
FIG. 35 depicts a photoresist pattern disposed over the metal layer.
Figure 36:
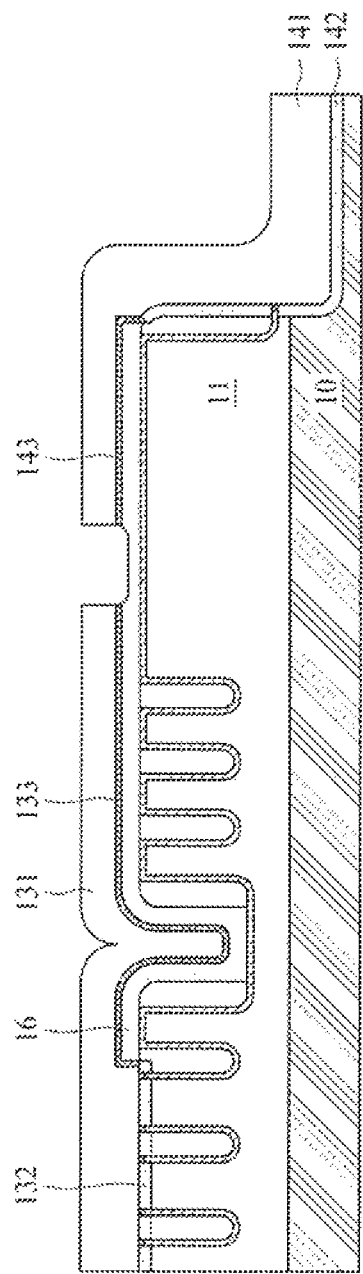
FIG. 36 depicts the etching of exposed metal layer to isolate the anode from the cathode.
Figure 37:
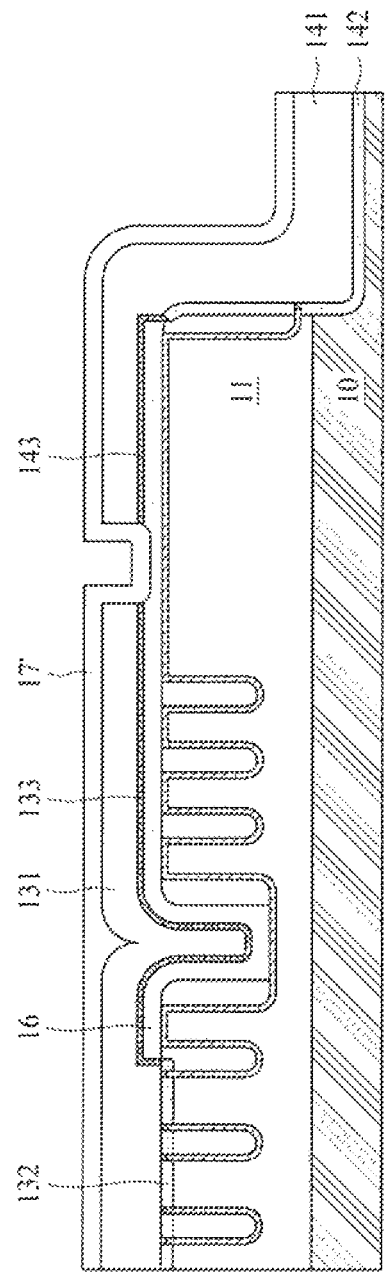
FIG. 37 depicts the deposition of a passivation layer over the wafer in FIG. 36.
Figure 38:
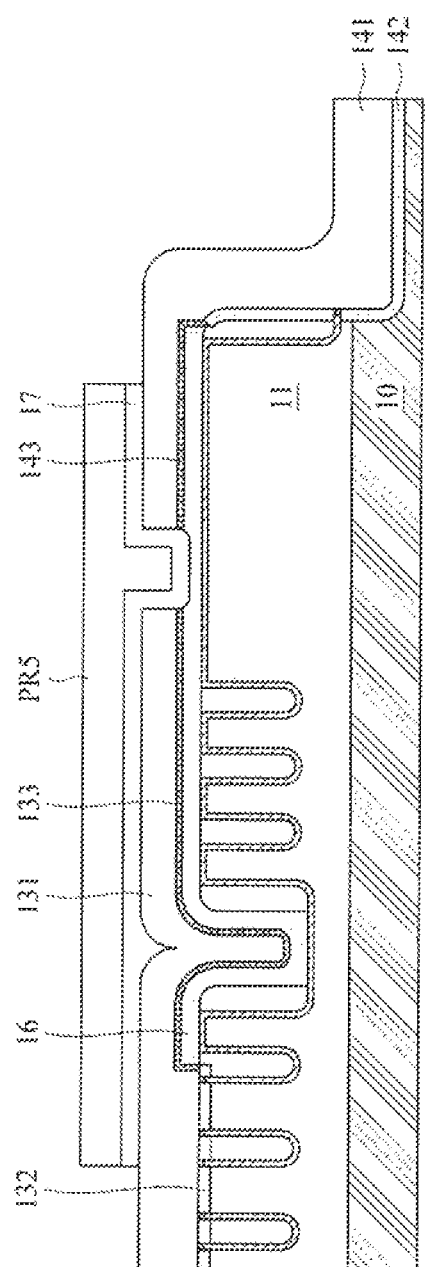
FIG. 38 depicts the structure of FIG. 37 after the passivation layer is removed from the cathode and the anode regions.

In some embodiments, as shown in FIGS. 34 and 35, the first metal layer is in contact with the polysilicon element and forms a silicide layer on the polysilicon element during the thermal treatment.

In some embodiments, the first metal layer comprises titanium, and the first and second silicide layers comprise titanium silicide.

In some embodiments, as shown in FIGS. 7 and 26, method 420 also includes forming a series of trench structures T1 in the anode region for forming guard rings.

Some embodiments further comprise using a same process to form the series of trench structures T1 and the first cathode trench structure T3, as shown in FIGS. 7 and 26.

In some embodiments, as shown in FIGS. 16-17 and 34-36, the method 420 also includes forming a second metal layer M2 over the first metal layer M1 and separating the second metal layer into an anode contact and a cathode layer.

According to some embodiments, a semiconductor Schottky device, as shown in FIGS. 2 and 21, includes a semiconductor substrate 10 and a semiconductor epitaxial layer (epi-layer) 11 over the substrate 10. The semiconductor Schottky device has an anode contact structure 301 and a cathode contact structure 401 both extending from a top surface of the epi-layer 11. The cathode contact structure 401 has a trench structure into the epi-layer with a vertical sidewall 403 of the epitaxial layer 11. The trench structure is shown as T3 in FIGS. 13-14 and as T3 and T33 in FIG. 33. A polysilicon element 152 is disposed in an upper portion of the sidewall of the trench structure. A first metal silicide film 142 is in contact with the epitaxial layer 11 in a lower portion of the sidewall T34 of the trench structure and in contact with the substrate at a bottom of the trench structure. The first metal silicide film 142 is connected to the cathode contact structure 401. A Schottky contact 303 is disposed between a second silicide layer 132 and the epi-layer 11. The Schottky contact is connected to the anode contact structure 301.

In some embodiments, the semiconductor Schottky device also has a step feature between the top surface of the epitaxial layer and the bottom of the trench structure.

In some embodiments, the polysilicon element 152 is disposed in an upper part of the step feature.

In some embodiments, a side of the polysilicon element 152 opposite the sidewall is covered with a dielectric film.

In some embodiments, the first metal silicide film 142 is in contact with the polysilicon element, as shown in FIGS. 21 and 36-39.

What is claimed is:

1. A method for forming a semiconductor Schottky rectifier device, the method comprising:
   providing a semiconductor substrate with a semiconductor epitaxial material layer disposed over the semiconductor substrate;
   forming a hard mask for trench etch including openings for guard rings, an anode region, and a cathode region;
   etching the semiconductor epitaxial material layer to form a plurality of trenches, including trenches for guard rings, a first trench in the anode region, and a second trench in the cathode region;
   forming a first dielectric layer and depositing a polysilicon layer;
   performing an anisotropic etch of the polysilicon layer to form polysilicon elements on sidewalls of the first trench in the anode region and on sidewalls of the second trench in the cathode region;
   depositing a second dielectric layer and etching the second dielectric layer to expose a Schottky diode region and a bottom region of the second trench in the cathode region;
   depositing a first metal layer and performing a thermal treatment to form metal silicide in the Schottky diode region and the cathode region, the metal silicide being in direct contact with the polysilicon elements on the sidewalls of the second trench in the cathode region; and
   forming a second metal layer and separating the second metal layer into an anode electrode and a cathode electrode.

2. The method of claim 1, further comprising etching a third trench inside the second trench in the cathode region.

3. The method of claim 2, wherein the third trench forms a step inside the second trench in the cathode region.

4. The method of claim 2, wherein the second trench in the cathode region has a substantially straight sidewall.

5. The method of claim 1, further comprising forming plated NiAu bumps for the anode electrode and the cathode electrode.

6. The method of claim 1, wherein the polysilicon layer fills the trenches for the guard rings.

7. A method for forming a semiconductor Schottky rectifier device, the method comprising:
   providing a semiconductor substrate with a semiconductor epitaxial material layer disposed over the semiconductor substrate, the semiconductor epitaxial material layer comprising a semiconductor epitaxial material;
   etching a first cathode trench structure extending into the semiconductor epitaxial material layer without penetrating through the semiconductor epitaxial material layer, the first cathode trench structure having vertical sidewalls of the semiconductor epitaxial material;
   forming a polysilicon element along the vertical sidewalls of the first cathode trench structure;
   depositing a dielectric layer over the first cathode trench structure and the polysilicon element;
   etching a second cathode trench structure inside the first cathode trench structure to form an intermediate device structure, the second cathode trench structure extending and penetrating through the semiconductor epitaxial material layer to reach the semiconductor substrate; and
   depositing a first metal layer and performing a thermal treatment to:
     form a first silicide layer at sidewalls of the semiconductor epitaxial material layer and the semiconductor substrate in the second cathode trench structure to form a cathode contact, the first silicide layer being in direct contact with the polysilicon element at the vertical sidewalls of the first cathode trench structure; and
     form a second silicide layer between the first metal layer and a top surface of the semiconductor epitaxial material layer in an anode region to form a Schottky junction diode;
   wherein the second silicide layer is separated from the first silicide layer.

8. The method of claim 7, wherein etching the second cathode trench structure forms a step feature between the top surface of the semiconductor epitaxial material layer and a bottom of the second cathode trench structure.

9. The method of claim 8, wherein the dielectric layer is disposed on a top surface of the step feature.

10. The method of claim 8, wherein the first metal layer is disposed on the dielectric layer on the polysilicon element.

11. The method of claim 7, wherein etching the second cathode trench structure removes the dielectric layer on the polysilicon element such that a sidewall of the second cathode trench structure is aligned with the polysilicon element on the vertical sidewalls of the first cathode trench structure, resulting in no step feature between the top surface of the semiconductor epitaxial material layer and a bottom of the second cathode trench structure.

12. The method of claim 11, wherein the first metal layer is in contact with the polysilicon element and forms a silicide layer on the polysilicon element during the thermal treatment.

13. The method of claim 7, wherein the first metal layer comprises titanium, and the first and second silicide layers comprise titanium silicide.

14. The method of claim 7, further comprising forming a series of trench structures in the anode region for forming guard rings.

15. The method of claim 14, further comprising using a same process to form the series of trench structures and the first cathode trench structure.

16. The method of claim 7, further comprising forming a second metal layer over the first metal layer and separating the second metal layer into an anode contact and a cathode layer.

* * * * *